(12) United States Patent
Suzaki

(10) Patent No.: US 11,929,272 B2
(45) Date of Patent: Mar. 12, 2024

(54) SUBSTRATE PROCESSING APPARATUS, SUBSTRATE SUPPORT, AND METHOD OF MANUFACTURING SEMICONDUCTOR DEVICE

(71) Applicant: KOKUSAI ELECTRIC CORPORATION, Tokyo (JP)

(72) Inventor: Kenichi Suzaki, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/944,299

(22) Filed: Jul. 31, 2020

(65) Prior Publication Data
US 2021/0035835 A1 Feb. 4, 2021

(30) Foreign Application Priority Data

Jul. 31, 2019 (JP) .................................. 2019-140606
Jul. 22, 2020 (JP) .................................. 2020-125259

(51) Int. Cl.
*H01L 21/67* (2006.01)
*F27B 17/00* (2006.01)
(Continued)

(52) U.S. Cl.
CPC .... *H01L 21/67309* (2013.01); *F27B 17/0025* (2013.01); *F27D 5/0037* (2013.01);
(Continued)

(58) Field of Classification Search
CPC ............. H01L 21/67309; H01L 21/324; H01L 21/67109; H01L 21/67306;
(Continued)

(56) References Cited

U.S. PATENT DOCUMENTS 6,811,040 B2 * 11/2004 Payne ............... H01L 21/67303
211/41.18
7,240,680 B2 * 7/2007 Egashira .................. B08B 3/02
134/158
(Continued)

FOREIGN PATENT DOCUMENTS

EP 0143479 A1 6/1985
JP 08-017753 A2 1/1996
(Continued)

OTHER PUBLICATIONS

Taiwanese Office Action dated Jun. 23, 2021 for Taiwanese Patent Application No. 109125780.
(Continued)

*Primary Examiner* — Mohammed Shamsuzzaman
(74) *Attorney, Agent, or Firm* — Volpe Koenig

(57) ABSTRACT

There is provided a technique that includes a substrate support including a support column made of metal and a plurality of supports installed at the support column and configured to support a plurality of substrates in multiple stages; a process chamber configured to accommodate the plurality of substrates supported by the substrate support; and a heater configured to heat the plurality of substrates accommodated in the process chamber, wherein the plurality of supports includes at least a contact portion configured to make contact with the plurality of substrates and made of at least one selected from the group of a metal oxide and a non-metal material.

7 Claims, 11 Drawing Sheets

(51) Int. Cl.
  *F27D 5/00* (2006.01)
  *H01L 21/324* (2006.01)
  *H01L 21/673* (2006.01)

(52) U.S. Cl.
  CPC ...... *H01L 21/324* (2013.01); *H01L 21/67109* (2013.01); *H01L 21/67306* (2013.01)

(58) Field of Classification Search
  CPC ......... H01L 21/67017; H01L 21/67103; H01L 21/67248; H01L 21/67326; H01L 21/6733; H01L 21/67757; F27B 17/0025; F27D 5/0037; C23C 16/4583
  See application file for complete search history.

(56) References Cited

U.S. PATENT DOCUMENTS

| | | | | |
|---|---|---|---|---|
| D570,308 S * | 6/2008 | Sato | ............................ | D13/182 |
| D580,894 S * | 11/2008 | Sato | ............................ | D13/182 |
| 7,501,370 B2 * | 3/2009 | Narendar | .......... | H01L 21/67309 |
| | | | | 211/41.18 |
| 7,661,544 B2 * | 2/2010 | Herzog | ............. | H01L 21/67309 |
| | | | | 211/41.18 |
| 8,230,806 B2 * | 7/2012 | Inoue | ....................... | C23C 16/56 |
| | | | | 118/724 |
| D734,730 S * | 7/2015 | Yoshida | ........................ | D13/182 |
| 9,099,507 B2 * | 8/2015 | Kobayashi | ........ | H01L 21/67253 |
| D739,831 S * | 9/2015 | Takagi | ......................... | D13/182 |
| 9,144,901 B2 * | 9/2015 | Yang | ...................... | H01L 21/673 |
| D740,769 S * | 10/2015 | Takagi | ......................... | D13/182 |
| D769,201 S * | 10/2016 | Kusakabe | .................... | D13/182 |
| D772,183 S * | 11/2016 | Kusakabe | .................... | D13/182 |
| D789,310 S * | 6/2017 | Kusakabe | .................... | D13/182 |
| 9,793,112 B2 * | 10/2017 | Joda | .................... | H01L 21/3247 |
| 9,816,182 B2 * | 11/2017 | Tateno | ............. | H01L 21/02222 |
| 10,008,402 B1 * | 6/2018 | Ogitsu | ............. | H01L 21/68735 |
| D839,219 S * | 1/2019 | Yoshida | ....................... | D13/182 |
| D846,514 S * | 4/2019 | Yoshida | ....................... | D13/182 |
| D847,105 S * | 4/2019 | Okajima | ....................... | D13/182 |
| 10,640,869 B2 * | 5/2020 | Okuda | .................. | C23C 16/455 |
| 10,770,287 B2 * | 9/2020 | Harada | .................. | C23C 16/345 |
| D908,102 S * | 1/2021 | Pacier | .......................... | D13/182 |
| D908,103 S * | 1/2021 | Pacier | .......................... | D13/182 |
| 10,998,205 B2 * | 5/2021 | Miyashita | ........... | C23C 16/4584 |
| 11,114,319 B2 * | 9/2021 | Yamaguchi | ............. | H01L 22/30 |
| D939,459 S * | 12/2021 | Shimada | ...................... | D13/182 |
| 11,232,963 B2 * | 1/2022 | Oosterlaken | ...... | H01L 21/68764 |
| 2002/0113027 A1 * | 8/2002 | Minami | ........... | H01L 21/67109 |
| | | | | 211/41.18 |
| 2003/0170583 A1 | 9/2003 | Nakashima et al. | | |
| 2014/0256160 A1 * | 9/2014 | Wada | ............. | H01L 21/02238 |
| | | | | 438/786 |
| 2017/0087606 A1 * | 3/2017 | Nakamura | ............. | C23C 16/52 |
| 2019/0186000 A1 * | 6/2019 | Inada | ................. | C23C 16/4412 |

FOREIGN PATENT DOCUMENTS

| | | |
|---|---|---|
| JP | 10-163120 A | 6/1998 |
| JP | 2001-127146 A | 5/2001 |
| JP | 2002-261035 A | 9/2002 |
| JP | 2003-324106 A | 11/2003 |
| JP | 2004-315975 A | 11/2004 |
| JP | 2018-170502 A | 11/2018 |
| KR | 10-2014-0085516 A | 7/2014 |
| TW | 502299 B | 9/2002 |
| TW | 561503 B | 11/2003 |
| TW | 201720541 A | 6/2017 |
| WO | 2013/077321 A1 | 5/2013 |
| WO | 2018-029819 A1 | 2/2018 |

OTHER PUBLICATIONS

Korean Office Action dated Nov. 22, 2021 for Korean Patent Application No. 10-2020-0095457.
Japanese Office Action dated Aug. 3, 2021 for Japanese Patent Application No. 2020-125259.
Korean Office Action dated Jul. 7, 2022 for Korean Patent Application No. 10-2020-0095457.
1 Chinese Office Action dated Jul. 19, 2023 for Chinese Patent Application No. 202010763399.4.

* cited by examiner

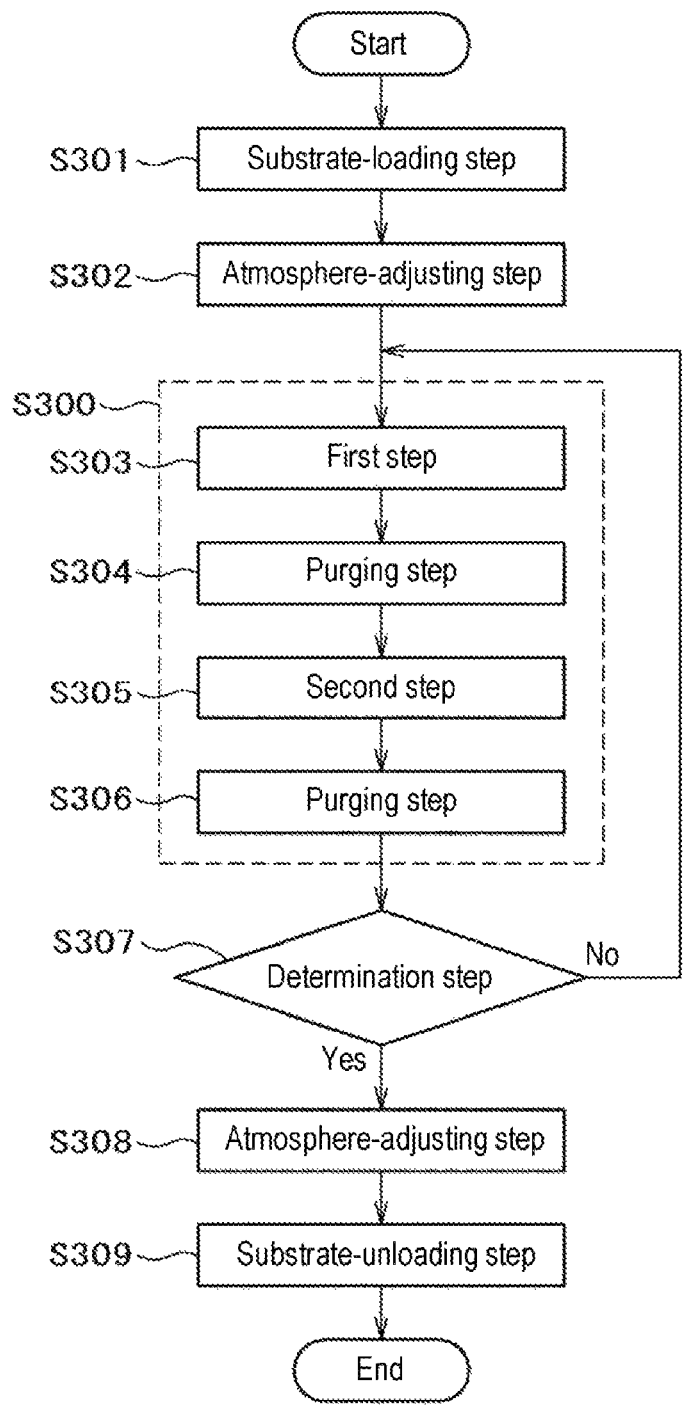

SUBSTRATE PROCESSING APPARATUS, SUBSTRATE SUPPORT, AND METHOD OF MANUFACTURING SEMICONDUCTOR DEVICE

CROSS-REFERENCE TO RELATED APPLICATION(S)

This application is based upon and claims the benefit of priority from Japanese Patent Application No. 2019-140606, filed on Jul. 31, 2019, and Japanese Patent Application No. 2020-125259, filed on Jul. 22, 2020, the entire contents of which are incorporated herein by reference.

TECHNICAL FIELD

The present disclosure relates to a substrate processing apparatus, a substrate support, and a method of manufacturing a semiconductor device.

BACKGROUND

As a process of manufacturing a semiconductor device, there may be performed a film-forming process of accommodating a plurality of substrates in a process chamber in a state in which the substrates are supported in multiple stages by a substrate support and forming a film on each of the accommodated substrates.

SUMMARY

In a process of manufacturing a semiconductor device, it is required to improve the uniformity of the thickness of a film formed on a substrate and to suppress metal contamination to the substrate and the film formed on the substrate.

Some embodiments of the present disclosure provide a technique capable of improving the uniformity of the thickness of a film formed on a substrate and suppressing metal contamination to the substrate and the film formed on the substrate.

According to one or more embodiments of the present disclosure, there is provided a technique that includes a substrate support including a support column made of metal and a plurality of supports installed at the support column and configured to support a plurality of substrates in multiple stages; a process chamber configured to accommodate the plurality of substrates supported by the substrate support; and a heater configured to heat the plurality of substrates accommodated in the process chamber, wherein the plurality of supports includes at least a contact portion configured to make contact with the plurality of substrates and made of at least one selected from the group of a metal oxide and a non-metal material.

BRIEF DESCRIPTION OF DRAWINGS

The accompanying drawings, which are incorporated in and constitute a part of the specification, illustrate embodiments of the present disclosure.

FIG. 13 is a flowchart showing the operation of the substrate processing apparatus shown in FIG. 1.

DETAILED DESCRIPTION

Figure 1:
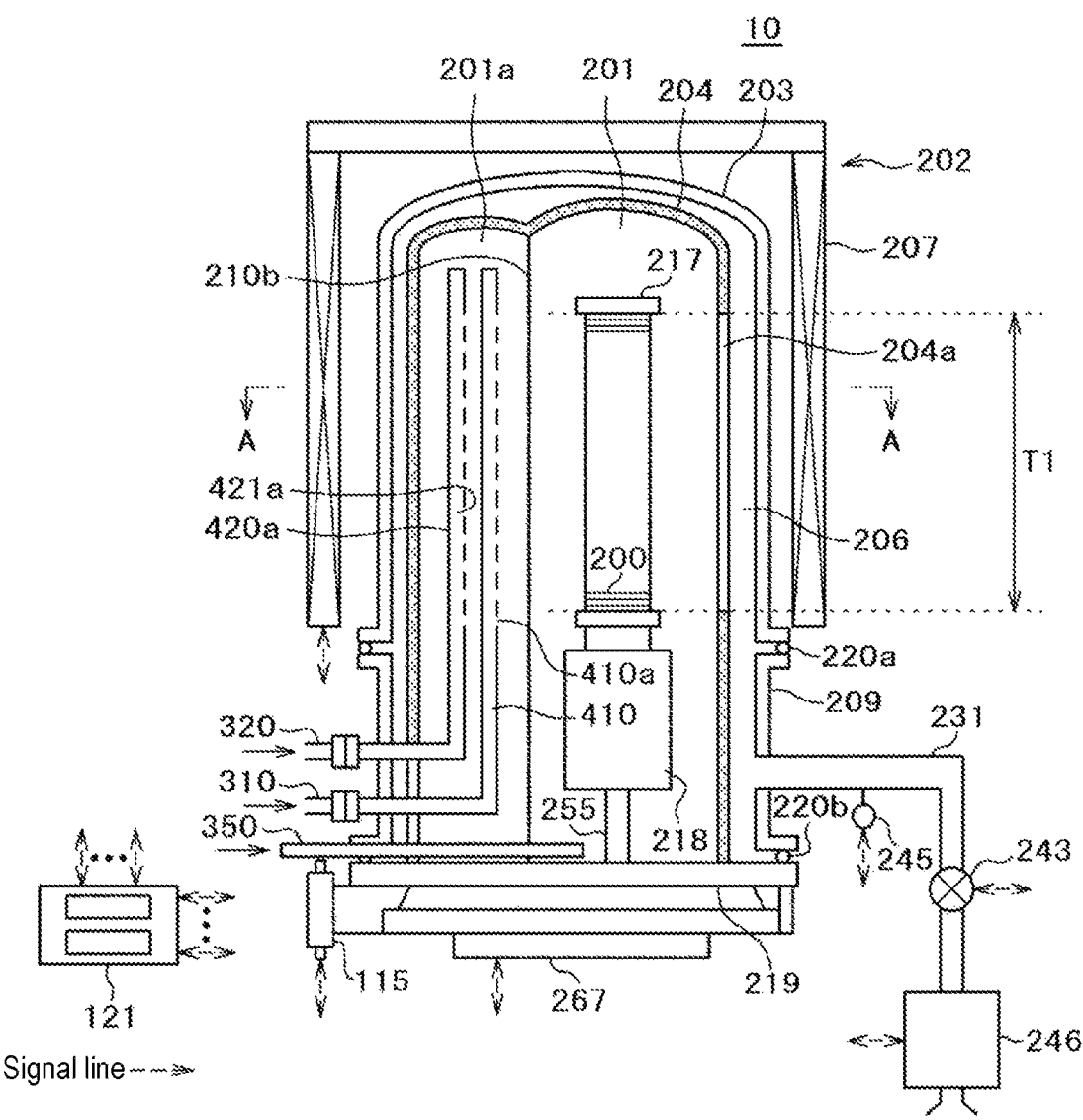
FIG. 1 is a vertical sectional view showing an outline of a vertical process furnace of a substrate processing apparatus.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments of the present disclosure will be described with reference to FIGS. 1 to 13. The substrate processing apparatus 10 is configured as an example of an apparatus used in a semiconductor-device-manufacturing process.

(1) Configuration of Substrate Processing Apparatus

The substrate processing apparatus 10 includes a process furnace 202 installed with a heater 207 as a heating part (heating mechanism or heating system). The heater 207 has a cylindrical shape and is vertically installed by being supported on a heater base (not shown) as a holding plate.

[Outer Tube 203]

Inside the heater 207, an outer tube 203 that constitutes a reaction container (process container) is arranged concentrically with the heater 207. The outer tube 203 is made of a heat-resistant material such as quartz ($SiO_2$) or silicon carbide (SiC), and has a cylindrical shape with a closed upper end and an open lower end. Below the outer tube 203, a manifold (inlet flange) 209 is arranged concentrically with the outer tube 203. The manifold 209 is made of metal such as stainless steel (SUS) or the like, and has a cylindrical shape with an open upper end and an open lower end. An O-ring 220a as a seal is installed between the upper end of the manifold 209 and the outer tube 203. As the manifold 209 is supported by the heater base, the outer tube 203 is vertically installed.

[Inner Tube 204]

Inside the outer tube 203, an inner tube 204 that constitutes a reaction container is arranged. The inner tube 204 is made of, for example, a heat-resistant material such as quartz or SiC, and has a cylindrical shape with a closed upper end and an open lower end. A process container (reaction container) mainly includes the outer tube 203, the inner tube 204, and the manifold 209. A process chamber 201 is formed in the hollow cylindrical portion of the process container (inside the inner tube 204).

The process chamber 201 is configured to be capable of accommodating wafers 200 as substrates in a state in which the wafers 200 are arranged on a below-described boat 217 in a horizontal posture in multiple stages and in a vertical direction. Nozzles (first nozzle 410 and second nozzle 420) are installed in the process chamber 201 to penetrate the side wall of the manifold 209 and the inner tube 204. Gas supply pipes 310 and 320 as gas supply lines are connected to the nozzles 410 and 420, respectively. As described above, the substrate processing apparatus 10 is installed with the two nozzles 410 and 420 and the two gas supply pipes 310 and 320, and is configured to be able to supply plural types of gases into the process chamber 201. However, the process furnace 202 of the present embodiments is not limited to the aforementioned form.

[Gas Supplier]

Figure 3:
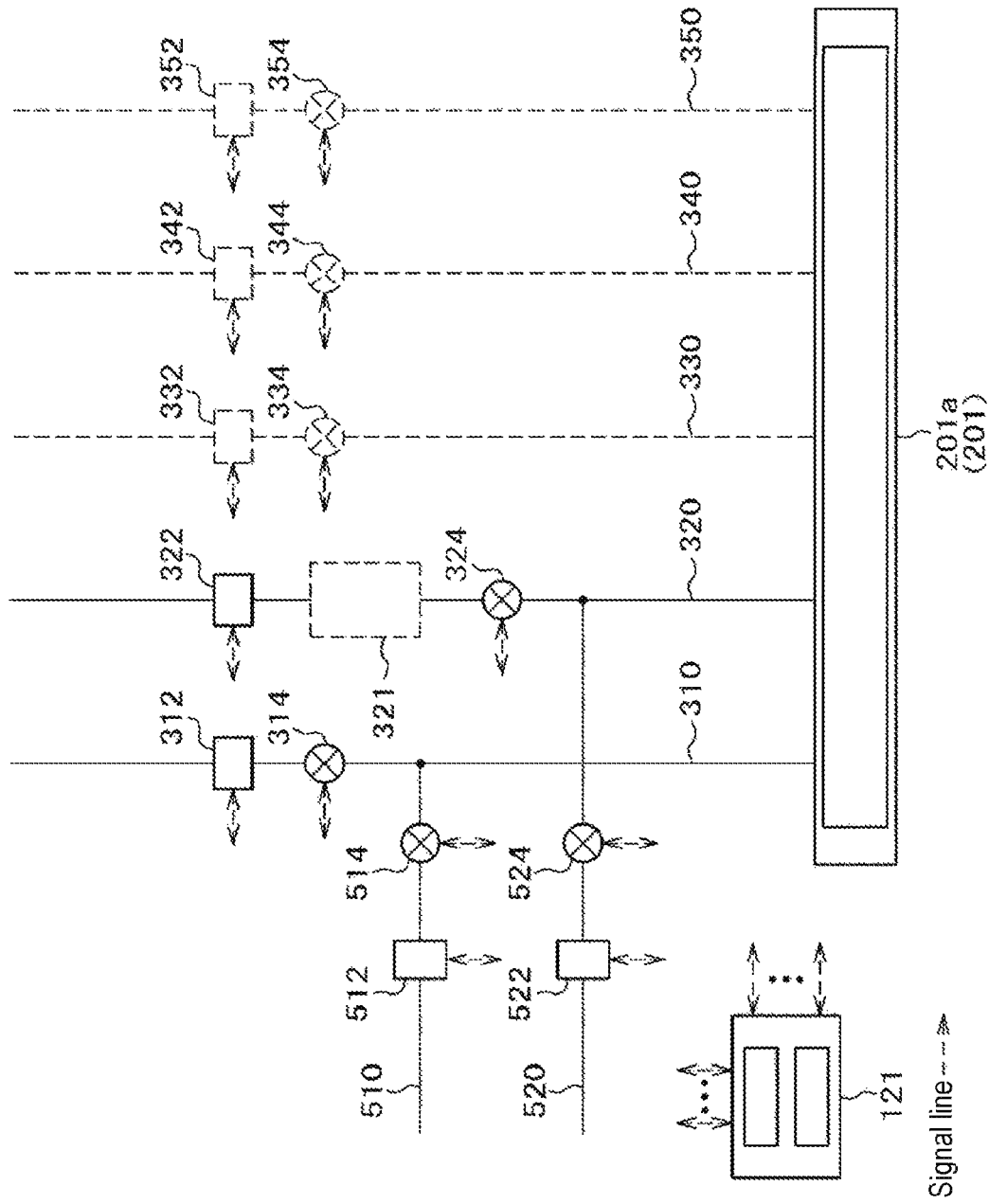
FIG. 3 is a schematic diagram of a gas supply system of the substrate processing apparatus shown in FIG. 1.

As shown in FIG. 3, mass flow controllers (MFCs) 312 and 322 as flow rate controllers (flow rate control parts) and valves 314 and 324 as opening/closing valves are installed in the gas supply pipes 310 and 320 sequentially from the upstream side, respectively. Gas supply pipes 510 and 520 for supplying an inert gas are connected to the gas supply pipes 310 and 320 on the downstream side of the valves 314 and 324, respectively. MFCs 512 and 522 as flow rate controllers (flow rate control parts) and valves 514 and 524 as opening/closing valves are installed in the gas supply pipes 510 and 520 sequentially from the upstream side, respectively.

Nozzles 410 and 420 are connected to the tip ends of the gas supply pipes 310 and 320, respectively. The nozzles 410 and 420 are configured as L-shaped nozzles, and the horizontal portions of the nozzles 410 and 420 are installed so as to penetrate the side wall of the manifold 209 and the inner tube 204. The vertical portions of the nozzles 410 and 420 are installed inside a channel-shaped (groove-shaped) preliminary chamber 201a which is formed so as to protrude radially outward of the inner tube 204 and extend in the vertical direction. The vertical portions of the nozzles 410 and 420 are installed inside the preliminary chamber 201a so as to extend upward along the inner wall of the inner tube 204 (upward in the arrangement direction of the wafers 200). Furthermore, the nozzles 410 and 420 are arranged outside the opening 201b of the preliminary chamber 201a. As indicated by a broken line in FIG. 3, a third nozzle (not shown) and a fourth nozzle (not shown) connected to gas supply pipes 330 and 340 capable of supplying a cleaning gas or an inert gas may be installed.

The nozzles 410 and 420 are installed so as to extend from a lower region of the process chamber 201 to an upper region of the process chamber 201. The nozzles 410 and 420 have a plurality of gas supply holes 410a and 420a installed at positions facing the wafers 200, respectively. Thus, a processing gas is supplied to the wafers 200 from the gas supply holes (openings) 410a and 420a of the nozzles 410 and 420, respectively.

The gas supply holes 410a are installed over a region from the lower portion to the upper portion of the inner tube 204. The gas supply holes 410a have the same opening area and are installed at the same opening pitch. However, the gas supply holes 410a are not limited to the aforementioned form. For example, the opening area may be gradually increased from the lower portion to the upper portion of the inner tube 204. Thus, the flow rate of the gas supplied from the gas supply holes 410a can be made more uniform.

The gas supply holes 420a are installed over a region from the lower portion to the upper portion of the inner tube 204. The gas supply holes 420a have the same opening area and are installed at the same opening pitch. However, the gas supply holes 420a are not limited to the aforementioned form. For example, the opening area may be gradually increased from the lower portion to the upper portion of the inner tube 204. Thus, the flow rate of the gas supplied from the gas supply holes 420a can be made more uniform.

The gas supply holes 410a and 420a of the nozzles 410 and 420 are installed at height positions from the bottom to the top of a boat 217 which will be described later. Therefore, the processing gas supplied from the gas supply holes 410a and 420a of the nozzles 410 and 420 into the process chamber 201 is supplied to the wafers 200 stored from the lower portion to the upper portion of the boat 217, i.e., the wafers 200 stored in the boat 217. The nozzles 410 and 420 may be installed so as to extend from the lower region to the upper region of the process chamber 201. The nozzles 410 and 420 are preferably installed so as to extend to the vicinity of the ceiling of the boat 217.

As a processing gas, a precursor gas containing a first metal element (a first metal-containing gas or a first precursor gas) is supplied from the gas supply pipe 310 into the process chamber 201 via the MFC 312, the valve 314, and the nozzle 410. Examples of the precursor include trimethylaluminum ($Al(CH_3)_3$, abbreviation: TMA) as an aluminum-containing precursor (Al-containing precursor gas or Al-containing gas) which is a metal-containing precursor gas (metal-containing gas) containing aluminum (Al) as a metal element. TMA is an organic precursor and is alkyl aluminum in which an alkyl group is bonded to aluminum. In addition, as the precursor, for example, tetrakisethylmethylaminozirconium (TEMAZ, $Zr[N(CH_3)C_2H_5]_4$) containing zirconium (Zr), which is a metal-containing gas and an organic precursor, may be used. TEMAZ is a liquid at a room temperature and atmospheric pressure and is vaporized by a vaporizer (not shown) and used as a TEMAZ gas which is a vaporized gas.

As a processing gas, a reaction gas is supplied from the gas supply pipe 320 into the process chamber 201 via the MFC 322, the valve 324, and the nozzle 420. As the reaction gas, an oxygen-containing gas (oxidizing gas or oxidant) as a reaction gas (reactant) containing oxygen (O) and reacting with Al may be used. As the oxygen-containing gas, for example, an ozone ($O_3$) gas may be used. A flash tank 321 indicated by a dotted line in FIG. 3 may be provided at the gas supply pipe 320. By providing the flash tank 321, it becomes possible to supply a large amount of $O_3$ gas to the wafers 200.

In the present embodiments, the precursor gas which is a metal-containing gas is supplied into the process chamber 201 from the gas supply holes 410a of the nozzle 410, and the reaction gas which is an oxygen-containing gas is supplied into the process chamber 201 from the gas supply holes 420a of the nozzle 420, whereby the precursor gas (metal-containing gas) and the reaction gas (oxygen-containing gas) are supplied to the surfaces of the wafers 200. Thus, a metal oxide film is formed on the surface of each of the wafers 200.

As the inert gas, for example, a nitrogen ($N_2$) gas is supplied from the gas supply pipes 510 and 520 into the process chamber 201 via the MFCs 512 and 522, the valves 514 and 524, and the nozzles 410 and 420, respectively. An example of using a $N_2$ gas as the inert gas will be described below. As the inert gas, for example, a rare gas such as an argon (Ar) gas, a helium (He) gas, a neon (Ne) gas, a xenon (Xe), or the like may be used in addition to the $N_2$ gas.

A gas supply system (gas supplier) mainly includes the nozzles 410 and 420. A processing gas supply system (gas supplier) may include the gas supply pipes 310 and 320, the MFCs 312 and 322, the valves 314 and 324, and the nozzles 410 and 420. Further, at least one selected from the group of the gas supply pipe 310 and the gas supply pipe 320 may be considered as the gas supplier. The processing gas supply system may be simply referred to as a gas supply system. When the precursor gas is supplied from the gas supply pipe 310, the precursor gas supply system mainly includes the gas supply pipe 310, the MFC 312, and the valve 314. The nozzle 410 may be included in the precursor gas supply system. Moreover, the precursor gas supply system may be referred to as a precursor supply system. When a metal-containing precursor gas is used as the precursor gas, the precursor gas supply system may also be referred to as a metal-containing precursor gas supply system. When the reaction gas is supplied from the gas supply pipe 320, a reaction gas supply system mainly includes the gas supply pipe 320, the MFC 322, and the valve 324. The nozzle 420 may be included in the reaction gas supply system. When the oxygen-containing gas is supplied as the reaction gas from the gas supply pipe 320, the reaction gas supply system may also be referred to as an oxygen-containing gas supply system. Furthermore, an inert gas supply system mainly includes the gas supply pipes 510 and 520, the MFCs 512 and 522, and the valves 514 and 524. The inert gas supply system may also be referred to as a purge gas supply system, a dilution gas supply system, or a carrier gas supply system.

In the gas supply method according to the present embodiments, a gas is conveyed via the nozzles 410 and 420 arranged in the preliminary chamber 201a in a vertically elongated annular space, i.e., a cylindrical space, defined by the inner wall of the inner tube 204 and the end portions of the wafers 200. The gas is injected into the inner tube 204 from the gas supply holes 410a and 420a of the nozzles 410 and 420 installed at positions facing the wafers. More specifically, the precursor gas or the like is injected from the gas supply holes 410a of the nozzle 410 and the gas supply holes 420a of the nozzle 420 in the direction parallel to the surfaces of the wafers 200, i.e., in the horizontal direction.

[Exhauster]

The exhaust hole (exhaust port) 204a is a through-hole formed in the side wall of the inner tube 204 at a position facing the nozzles 410 and 420, i.e., at a position 180 degrees opposite to the preliminary chamber 201a, and is, for example, a slit-shaped through-hole elongated in the vertical direction. Therefore, the gas supplied into the process chamber 201 from the gas supply holes 410a and 420a of the nozzles 410 and 420 and flowing on the surfaces of the wafers 200, i.e., the remaining gas (residual gas), flows through the exhaust hole 204a into an exhaust passage 206 formed by the gap between the inner tube 204 and the outer tube 203. Then, the gas flowing into the exhaust passage 206 flows into an exhaust pipe 231 and is discharged to the outside of the process furnace 202. An exhauster includes at least the exhaust pipe 231.

The exhaust hole 204a is installed at a position facing the wafers 200 (preferably at a position facing a region from the upper portion to the lower portion of the boat 217). The gas supplied from the gas supply holes 410a and 420a to the vicinity of the wafers 200 in the process chamber 201 flows in the horizontal direction, i.e., in the direction parallel to the surfaces of the wafers 200, and then flows into the exhaust passage 206 via the exhaust hole 204a. That is, the gas remaining in the process chamber 201 is exhausted in parallel to the main surfaces of the wafers 200 via the exhaust hole 204a. The exhaust hole 204a is not limited to being formed as a slit-shaped through-hole, but may be configured by a plurality of holes.

An exhaust pipe 231 that exhausts the atmosphere in the process chamber 201 is installed in the manifold 209. In the exhaust pipe 231, a pressure sensor 245 as a pressure detector (pressure detection part) for detecting the pressure inside the process chamber 201, an APC (Auto Pressure Controller) valve 243, and a vacuum pump 246 as a vacuum exhaust device are installed sequentially from the upstream side. The APC valve 243 may perform vacuum exhaust and vacuum exhaust stop in the process chamber 201 by being opened and closed while operating the vacuum pump 246. Furthermore, the APC valve 243 may adjust the pressure in the process chamber 201 by adjusting the valve-opening degree while operating the vacuum pump 246. An exhaust system, i.e., an exhaust line mainly includes the exhaust hole 204a, the exhaust passage 206, the exhaust pipe 231, the APC valve 243, and the pressure sensor 245. The vacuum pump 246 may be included in the exhaust system.

As shown in FIG. 1, below the manifold 209, there may be installed a seal cap 219 as a furnace opening lid that can hermetically close the lower end opening of the manifold 209. The seal cap 219 is configured to make contact with the lower end of the manifold 209 from below in the vertical direction. The seal cap 219 is made of metal such as SUS or the like and has a disc shape. On the upper surface of the seal cap 219, there is installed an O-ring 220b as a seal that comes into contact with the lower end of the manifold 209. On the opposite side of the seal cap 219 from the process chamber 201, there is installed a rotator 267 for rotating the boat 217 that accommodates the wafers 200. A rotating shaft 255 of the rotator 267 penetrates the seal cap 219 and is connected to the boat 217. The rotator 267 is configured to rotate the wafers 200 by rotating the boat 217. The seal cap 219 is configured to be raised or lowered in the vertical direction by a boat elevator 115 as an elevating mechanism vertically installed outside the outer tube 203. The boat elevator 115 is configured to be capable of loading and unloading the boat 217 into and out of the process chamber 201 by raising and lowering the seal cap 219. The boat elevator 115 is configured as a transfer device (transfer mechanism) that transfers the boat 217 and the wafers 200 accommodated in the boat 217 into and out of the process chamber 201.

The boat 217 serving as a substrate support is configured to support a plurality of wafers 200, e.g., 25 to 200 wafers, in such a state that the wafers 200 are arranged in a horizontal position and in multiple stages along a vertical direction with the centers of the wafers 200 aligned with one another. That is, the boat 217 is configured to arrange the wafers 200 at intervals. Details of the boat 217 will be described later. Below the boat 217, there is installed a heat-insulating portion 218 made of a heat-resistant material such as quartz or SiC. With this configuration, the heat from the heater 207 is less likely to be transferred to the seal cap 219.

Figure 2:
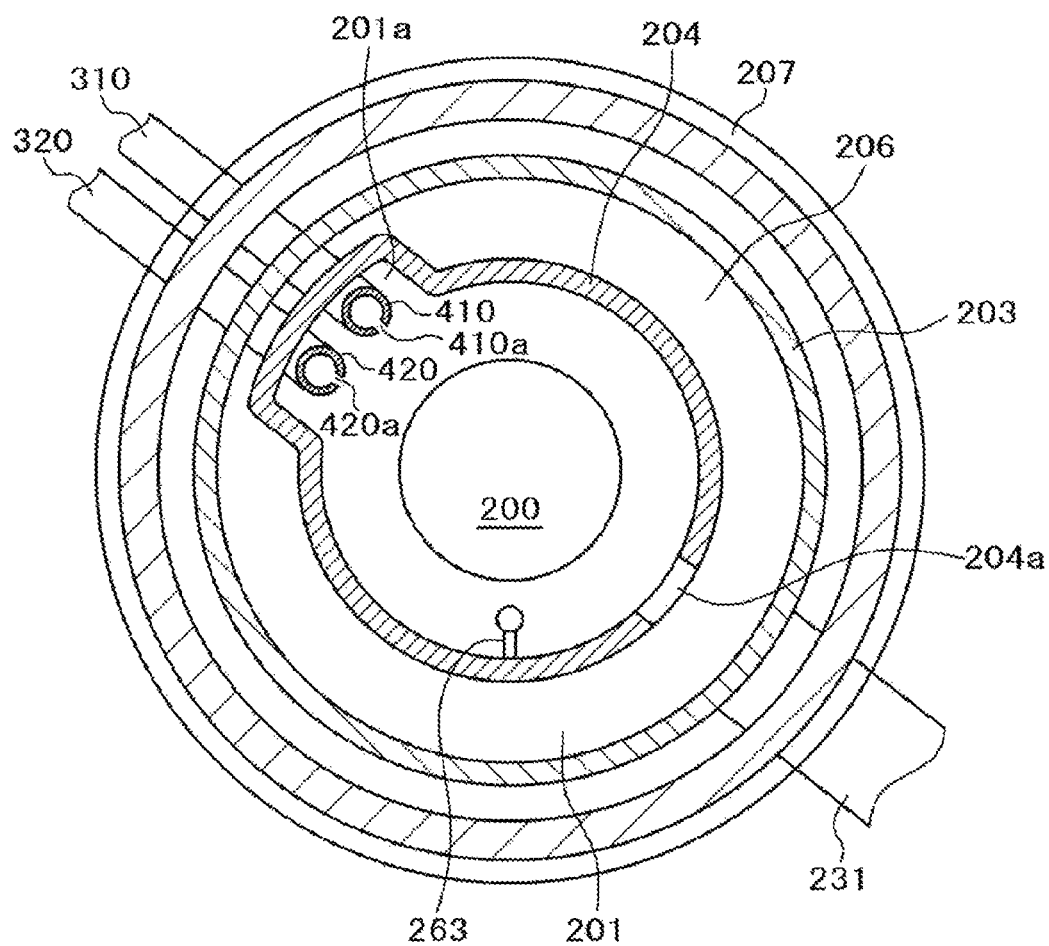
FIG. 2 is a schematic horizontal sectional view taken along line A-A in FIG. 1.

As shown in FIG. 2, a temperature sensor 263 as a temperature detector is installed in the inner tube 204. By adjusting the amount of supplying electric power to the heater 207 based on the temperature information detected by the temperature sensor 263, the temperature inside the process chamber 201 is controlled to provide a desired temperature distribution. Similarly to the nozzles 410 and 420, the temperature sensor 263 is formed in an L-shape and is installed along the inner wall of the inner tube 204.

With this configuration, the temperature in at least the region of the boat 217 supporting the wafers 200 is kept uniform. There is a difference between the temperature in the uniform heating temperature region (uniform heating region T1) and the temperature in the region below T1. T1 is also referred to as a substrate-processing region. The length of the substrate-processing region in the vertical direction is shorter than or equal to the length of the uniform heating region in the vertical direction. The substrate-processing region means a position where the wafers 200 are supported (placed), in the vertical position of the boat 217. As used herein, the term "wafers 200" means at least one selected from the group of product wafers, dummy wafers, and fill dummy wafers. Moreover, the term "substrate-processing region" means a region of the boat 217 where the wafers 200 are held. That is, the substrate-processing region is also called a substrate-holding region.

[Boat (Substrate Support) 217]

Figure 4:
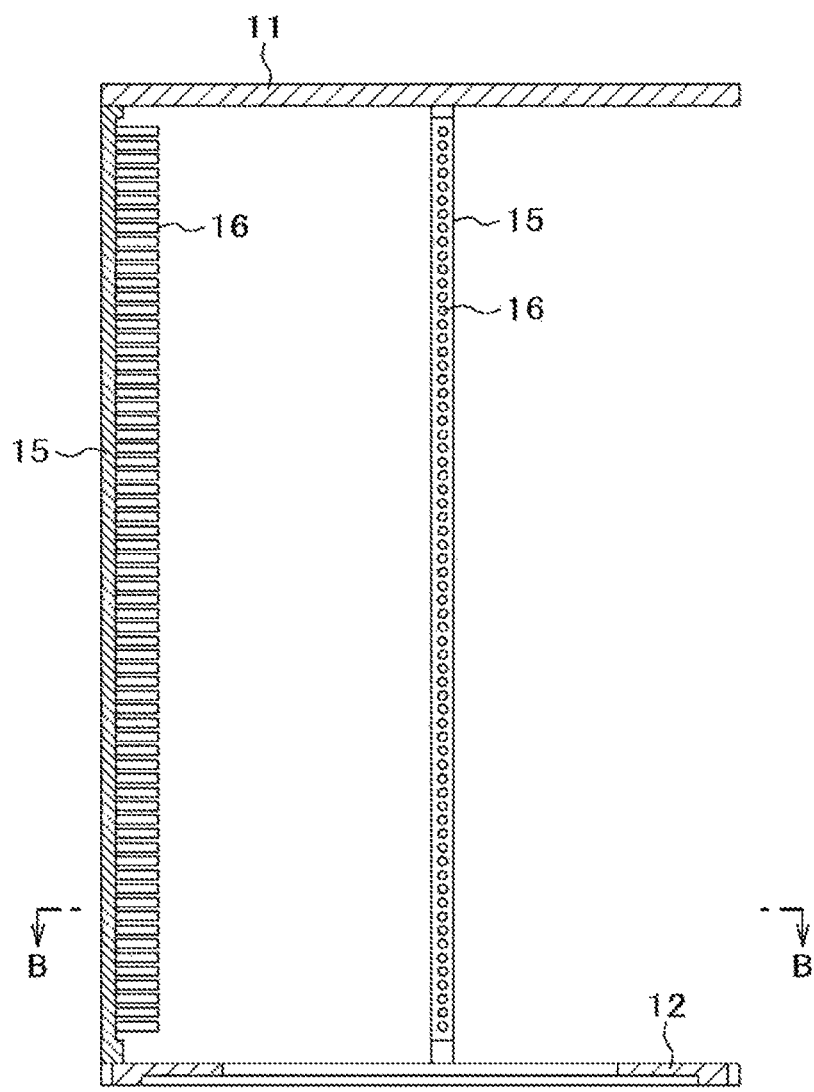
FIG. 4 is a side view showing a boat accommodated in the substrate processing apparatus shown in FIG. 1.

As shown in FIG. 4, the boat 217 includes a bottom plate 12 and a top plate 11 as two parallel plates, and a plurality of, for example, three, support columns 15 installed substantially vertically between the bottom plate 12 and the top plate 11. The support columns 15 have a circular columnar shape. In order to support the wafers 200 in a stable and simple manner, the number of support columns 15 is preferably three. However, the number of support columns 15 may be more than three. At least the support columns 15 of the boat 217 are made of, for example, stainless steel as a metallic member which is coated with a chromium oxide film (CrO film) as a metal oxide film. Examples of stainless steel may preferably include SUS316L, SUS836L, and SUS310S. Stainless steel contains metal elements (e.g., Fe, Ni, Cr, Cu, etc.) that may deteriorate the characteristics of the wafers 200 or the films formed on the wafers 200. The entry of these metal elements as impurities into the wafers 200 or the films formed on the wafers 200 is called metal contamination.

Figure 5:
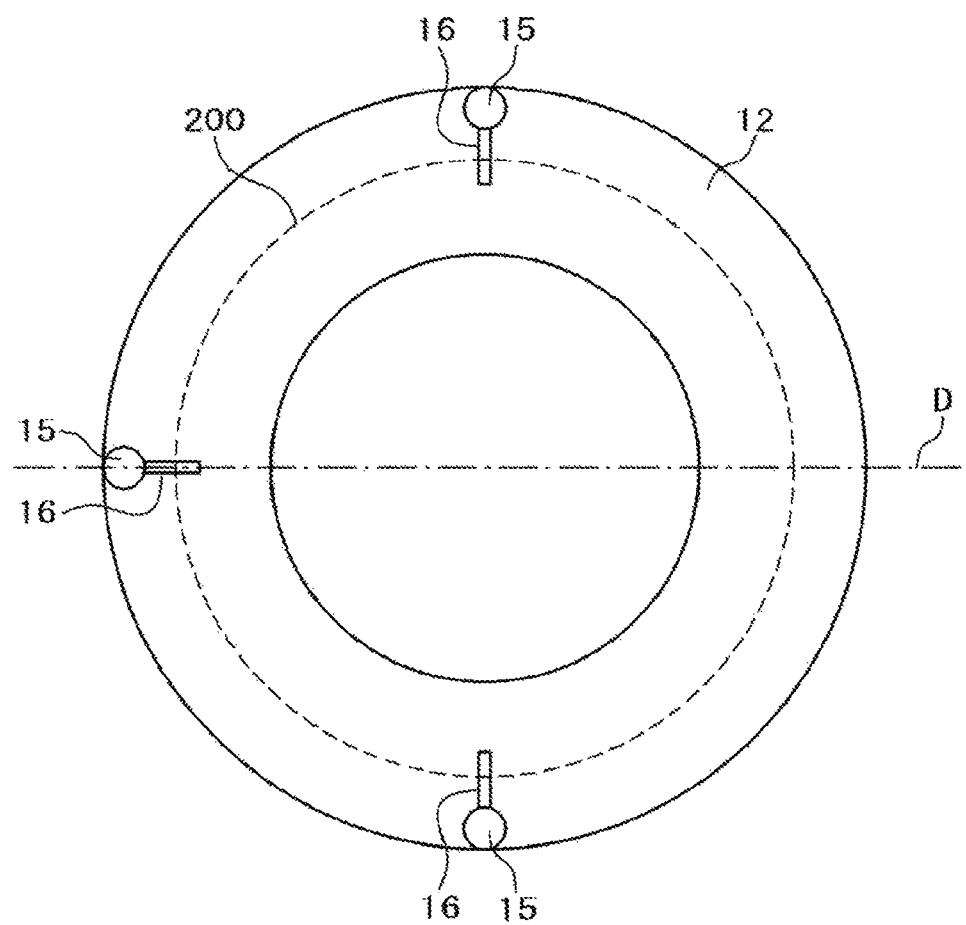
FIG. 5 is a schematic horizontal sectional view taken along line B-B in FIG. 4.

The three support columns 15 are arranged in a substantially semicircular shape and fixed to the bottom plate 12. The top plate 11 is fixed to the upper ends of the three support columns 15. As shown in FIG. 5, the boat 217 includes a plurality of support columns 15. The support columns 15 are installed along the outer circumference of the wafer 200 to be supported. The support column 15 serving as a reference is located on a reference line D indicated by a one-dot chain line, and the remaining support columns 15 are installed at positions symmetrical with respect to the reference line D.

Figure 6:
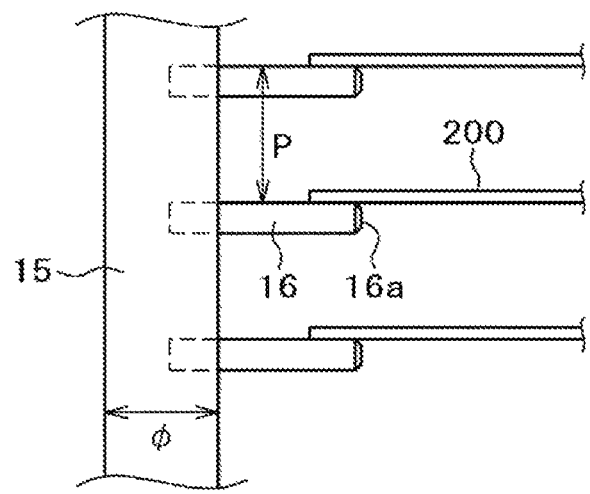
FIG. 6 is an explanatory view showing a wafer supporting state in the boat shown in FIG. 4.

As shown in FIGS. 4 and 6, in each of the support columns 15, a plurality of support pins 16 as supports (mounting stages) capable of supporting (mounting) a plurality of wafers 200 in a substantially horizontal posture by arranging the wafers 200 at predetermined intervals (P) in the vertical direction is installed in multiple stages. The support pins 16 are made of stainless steel similar to the support columns 15 and are installed to protrude inward of the boat 217. As shown in FIG. 5, each of the support pins 16 has a cylindrical shape and is installed so as to protrude toward the center of the boat 217, i.e., the centers of the wafers 200. In this case, one support pin 16 is provided on each of the support columns 15. That is, three support pins 16 are installed so as to protrude in one stage. The wafer 200 is supported by supporting the outer periphery of the wafer 200 on the three support pins 16 provided in a protruding manner. It is preferable that the support pins 16 are kept horizontal. By keeping the wafer 200 horizontal, it is possible to avoid interference such as the wafer 200 coming into contact with the support pins 16 during the transfer of the wafer 200, and to ensure a uniform gas flow on the wafer 200 supported by the boat 217.

Since the support columns 15 of the boat 217 of the present embodiments are formed of metal members, they may be made thinner than the support columns of the conventional boat made of quartz or SiC. For example, the diameter φ of the support columns of the conventional boat is 19 mm, and the diameter φ of the support columns 15 of the boat 217 of the present embodiments shown in FIG. 6 is 5 to 10 mm. The diameter of the support columns 15 is set in advance so as to have strength large enough to support the wafer 200 on the support pins 16. Therefore, the diameter φ (5 to 10 mm) of the support columns 15 according to the present embodiments is nothing more than an example. The present embodiments encompass a case where the diameter of the support columns 15 having the strength capable of supporting the wafer 200 is smaller than 5 mm depending on the number of support columns 15.

For example, if the diameter of the support column 15 is small, the flow of the film-forming gas is less likely to be hindered, and the retention of the film-forming gas is less likely to occur. Furthermore, since the surface area of the support columns 15 is reduced, the consumption of the film-forming gas decreases. Therefore, it is possible to alleviate deterioration in film thickness uniformity due to a decrease in film thickness in the vicinity of each of the support columns 15. Furthermore, as the diameter of the support columns 15 is reduced, the diameter of the support pins 16 may be reduced as well. However, according to the present embodiments, the support pins 16 are made of stainless steel as a metal member similar to the support columns 15, thereby making it possible to secure the strength capable of supporting the wafer 200.

The support pins 16 are inserted into the holes as recesses installed in the support columns 15 and are fixed at predetermined intervals (P) (e.g., at an 8 mm pitch) by welding or the like. Furthermore, as shown in FIG. 6, the tip ends 16a of the columnar support pins 16 may be rounded or chamfered.

Furthermore, at least the contact point (contact portion) of the support pin 16 with the wafer 200 is coated with a CrO film which is a metal oxide film. At least the contact point of the support pin 16 with the wafer 200 may be coated with a silicon oxide film (SiO film), which is a non-metal film containing no metal element, instead of the CrO film.

Furthermore, a part or the entirety of the support pin 16 may be coated with a CrO film, and at least the contact point of the support pin 16 with the wafer 200 may be further coated with a SiO film. The coating of the SiO film may be performed on at least the contact point with the wafer 200, and more preferably, on the entire portion protruding from the support column 15. As a result, even if metal contamination cannot be sufficiently suppressed by the coating of the CrO film, it is possible to reliably suppress metal contamination by coating the portion, which makes contact with the wafer 200, with the SiO film.

The support pin 16 (support) may have not only a circular columnar shape but also another columnar shape such as a semi-circular columnar shape having a flat surface on the side of a contact surface with the wafer 200, a quadrangular columnar shape, a triangular columnar shape or the like, or a plate shape. Furthermore, the support pin 16 (support) may have a semi-circular columnar shape having a curved surface on the side of a contact surface with the wafer 200.

In addition, in the present embodiments, the CrO film is applied as one of the preferred examples of the metal oxide film that coats the support columns 15 and the support pins 16. However, the present disclosure is not limited thereto. An aluminum oxide (AlO) film may be applied as an example of other preferred metal oxide films. A titanium oxide (TiO) film, a zirconium oxide (ZrO) film, a hafnium oxide (HfO) film, or the like may be applied as a further example of other preferred metal oxide films. Moreover, in the present embodiments, there has been described the example in which the support columns 15 and the support pin 16 are coated with the CrO film which is a metal oxide film. Instead of the metal oxide film, the support columns 15 and the support pin 16 may be coated with a non-metal material film containing no metal element such as silicon (Si), silicon oxide (SiO), silicon nitride (SiN), or SiC. It may be coated with a film of a non-metal material containing no metal element such as (SiN) or SiC. Furthermore, as a Si coating method, it may be possible to use Si spraying which is easy to partially coat the contact point (contact portion).

When the boat 217 is used in the process of forming the metal-containing film on the wafer 200, the boat 217 may be coated with the metal contained in the metal-containing film. For example, when the boat 217 is used in the process of forming an AlO film as the metal-containing film, the above coating may be performed with Al by spraying aluminum (Al) which is the metal contained in the AlO film.

In the present embodiments, the support columns 15 are formed of stainless steel which is a metal. As a result, it is possible to reduce the diameter of the support columns of the boat while securing the same strength as that of the support columns of the boat made of quartz or the like, and it is possible to suppress the film thickness reduction that may occur near the support columns of the boat.

Furthermore, in the present embodiments, at least a part of the support column 15 and the support pin 16 constituting the boat 217 is coated with at least one selected from the group of a metal oxide film and a non-metal film. As a result, it is possible to suppress metal contamination of the wafer 200 due to the metal members constituting the boat 217.

Furthermore, in the present embodiments, at least the contact point (contact portion) of the support pin 16 with the wafer 200 is coated with at least one selected from the group of the metal oxide film and the non-metal film. As a result, it is possible to suppress metal contamination of the wafer 200 due to the support pin 16 that comes into contact with the wafer 200.

Furthermore, in the present embodiments, the support column 15 is coated with at least one selected from the group of the metal oxide film and the non-metal film. As a result, it is possible to suppress metal contamination caused by the metal constituting the support column 15 and to maintain the level of metal contamination at a lower level.

Further, as in the present embodiments, if the portions of the support columns 15 and the support pins 16 other than the contact portions with the wafer 200 are coated with at least one selected from the group of the metal oxide film and the non-metal film, when a film of a deposit is formed on the surface of the support column 15 or the like, it is possible to relax the stress generated between the surface of the support column 15 and the film of the deposit due to the temperature change, and to suppress generation of cracks and film peeling in the film of the deposit and the resultant generation of particles. That is, when a film-forming process to the wafer 200 is performed, a metal oxide film or a non-metal film having a stress acting in the same direction as the film of the deposit formed on the surface of the support column 15 in the film-forming process is coated on the surface of the support column 15 as a stress buffer film. In this case, the metal oxide film or the non-metal film used for coating is selected according to the type of the film formed in the film-forming process.

Further, in the present embodiments, both the support column 15 and the support pin 16 made of stainless steel are coated with at least one selected from the group of the metal oxide film and the non-metal film. This makes it possible to perform coating on the boat 217 through a single treatment. The CrO film can be formed on the surface of stainless steel by, for example, passivation treatment of stainless steel. Furthermore, when coating is performed with the same type of film (e.g., an AlO film, etc.) as the film formed in the film-forming process to the wafer 200 instead of the CrO film, the boat 217 in which the wafer 200 is not mounted may be loaded into the process chamber 201, and the same process as the film-forming process to the wafer 200 may be performed to perform coating on the boat 217.

In addition, in the present embodiments, the surface of the support column 15 is coated with the CrO film or the like. However, the surface of the support column 15 may not be coated with the metal oxide film or the non-metal film, and the metal base material may be exposed on the surface thereof.

According to the verification conducted by the disclosing person, it was confirmed that under the condition of 250 degrees C. or higher and 400 degrees C. or lower, by securing a distance of at least 8 mm or longer, preferably 12 mm or longer, between a member made of stainless steel and a Si wafer, it is possible to suppress metal contamination of the Si wafer caused by stainless steel. Therefore, by mounting the wafer 200 on the support pin 16 so as to be spaced apart by a predetermined distance from the surface of the support column 15, and by forming the surface of the support pin 16 with at least one selected from the group of the metal oxide film and the non-metal film without coating the surface of the support column 15 with the metal oxide film or the non-metal film, it is possible to suppress metal contamination of the wafer 200 and the like due to the metal constituting the support column 15 and the support pin 16. In addition, when the boat 217 is used under condition of 400 degrees C. or lower, the predetermined distance may be preferably 8 mm or longer, more preferably 12 mm or longer. By not performing a coating process on the surface of the support column 15 in this way, the boat 217 can be manufactured more easily than when the coating process is performed.

First Modification

Figure 7:
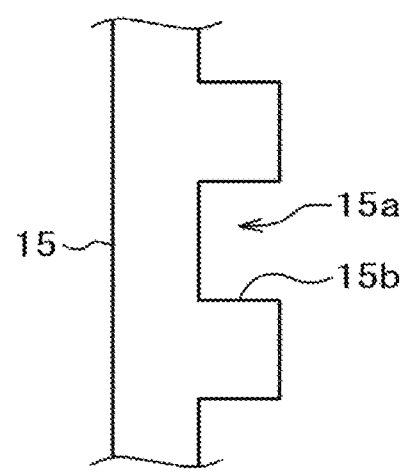
FIG. 7 is a side view of a support column of a boat according to a first modification.

As shown in FIG. 7, instead of the support pins 16, a plurality of grooves 15a engraved on the support column 15 may be used as supports (mounting stages), and the wafer 200 may be supported (mounted) on the bottom surface 15b of each of the grooves 15a. As in the above-described embodiments, the support column 15 according to the first modification of the above-described embodiments is coated with a CrO film which is a metal oxide film. In particular, at least a portion (i.e., a contact point (contact portion)) of the semicircular bottom surface 15b of each of the grooves 15a on which the wafer 200 is supported is coated with a CrO film. Furthermore, at least the contact point of the semicircular bottom surface 15b of each of the grooves 15a that makes contact with the wafer 200 may be coated with a SiO film, which is a non-metal film, instead of the CrO film. Alternatively, each of the grooves 15a may be coated with a CrO film, and at least the contact point of the semicircular bottom surface 15b of each of the grooves 15a that makes contact with the wafer 200 may be further coated with a SiO film.

Second Modification

Figure 8:
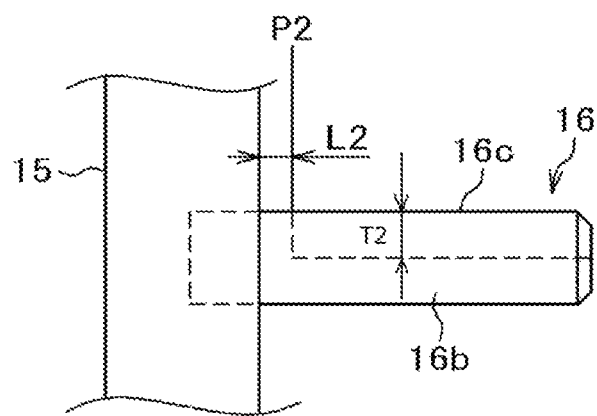
FIG. 8 is a side view of a support column and a support pin of a boat according to a second modification.

As shown in FIG. 8, the support pin 16 according to the second modification of the present embodiments has a hybrid configuration that includes a metal portion 16b made of a metal member and a quartz portion 16c made of a non-metal member containing no metal element. The metal portion 16b has the same structure as the support pin 16 of the above-described embodiments. The metal portion 16b is inserted into the hole as a recess installed in the support column 15 and fixed by welding. The wafer 200 is mounted on the quartz portion (quartz region) 16c. The quartz portion 16c is formed of a quartz piece, and is an upper half of the circular columnar support pin 16 of the above-described embodiments that faces the wafer 200 mounted on the support pin 16. The range from the position (P2) spaced apart by a predetermined distance (L2) from the support column 15 and not affected by the welding to the tip of the support pin 16 is configured by quartz (SiO). That is, in the second modification, at least the contact point between the wafer 200 and the support pin 16 is formed of the quartz portion 16c which is not a metal. The quartz portion 16c may be made of other non-metal such as SiC or SiN instead of quartz.

In the metal portion 16b, the portion embedded in the hole of the support column 15 and the portion from the surface of the support column 15 to the position P2 have a circular cross section, and the portion from the position P2 to the tip of the support column 15 has a semicircular cross section. The quartz portion 16c has a semicircular columnar shape whose cross section is semicircular. However, the quartz portion 16c is not limited to the semi-circular columnar shape, and may have other columnar shapes. The contact surface of the quartz portion 16c with the wafer 200 may have a flat plate shape or chip shape, or may have other shapes. In the present disclosure, the members having these shapes are collectively referred to as piece-shaped members. The thickness T2 of the quartz portion 16c in the vertical direction is, for example, 0.5 mm or larger and smaller than 10 mm, more preferably 1 mm or larger and smaller than 5 mm. If the thickness T2 is smaller than 0.5 mm, the quartz portion 16c may possibly be damaged when mounting the wafer 200. By setting the thickness T2 to 1 mm or larger, it is possible to more reliably prevent the quartz portion 16c from being damaged when mounting the wafer 200.

In the metal portion 16b, the portion below the quartz portion 16c and the portion from the surface of the support column 15 to the position P2 are coated with at least one selected from the group of a CrO film and a SiO film.

The metal member constituting the support column 15 and the metal member constituting the metal portion 16b of the support pin 16 are joined by welding. After welding, the CrO film is coated or passivated to thereby remove the welding trace at the welded portion. Thus, the surface becomes a CrO film surface as the non-welded portion. The concentration of impurities other than chromium (Cr) and oxygen (O) can be made equal to that of the non-welded portion. Since the contact surface with the wafer 200 is composed of the quartz portion 16c which is a non-metal member, the surface coating film such as the CrO film or the SiO film is not peeled off by the contact with the wafer 200.

In the second modification, there has been described the form in which the surfaces of the support column 15 and the metal portion 16b are coated with the CrO film or the like. However, as a further modification of the second modification, the surface of at least one selected from the group of the support column 15 and the metal portion 16b is not coated with any one of the metal oxide film and the non-metal film, and the metal base material thereof may be exposed on the surface. By configuring at least the contact portion between the wafer 200 and the support pin 16 with the non-metal quartz portion 16c, it is possible to suppress metal contamination of the wafer 200 and the like caused by the metal that constitutes the support column 15 and the metal portion 16b. By not performing the coating process to the surface of at least one selected from the group of the support column 15 and the metal portion 16b as described above, the boat 217 can be manufactured more easily than when the coating process is performed.

As a still further modification of the second modification, the support pin 16 may be coated with a metal oxide film such as a CrO film or the like or a non-metal film, and a part of the contact point of the support pin 16 with the wafer 200 may be formed of quartz such as a quartz coat or a quartz chip. That is, the contact point of the support pin 16 with the wafer 200 may be formed of a CrO film and quartz.

Third Modification

Figure 9:
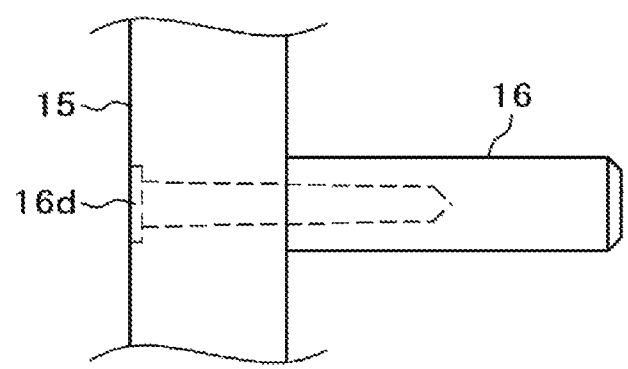
FIG. 9 is a side view of a support column and a support pin of a boat according to a third modification.

The support pin 16 according to a third modification of the present embodiments is entirely made of a non-metal material or a metal oxide such as quartz, SiC, SiN, AlO, or the like. As shown in FIG. 9, the support pin 16 is fixed to the support column 15 by inserting a screw 16d as a columnar member passing through a hole installed in the support column 15 into a screw hole as a recess formed in the support pin 16 and screwing the screw 16d to the screw hole. Other members constituting the boat 217 are stainless steel coated with a CrO film which is a metal oxide film, or a SiO film which is a non-metal film. The support pin 16 may be fixed to the support column 15 by forming a recess formed in the support pin 16 as a hole having no screw groove and inserting a pin-shaped fixing member having no screw groove into the recess instead of the screw 16d. The wire processing technique is used to hide the screw 16d to form a flat surface, thereby improving the coverage of the SiO film.

It may be possible to adopt a structure (fitting structure) in which a protrusion is installed on the side of the support pin 16 facing the support column 15 and is inserted into a recess or a through-hole formed at the support column 15. The support pin 16 and the support column 15 may be joined by welding. Alternatively, the protrusion of the support pin 16 may be formed in a screw shape, and the recess or the through-hole of the support column 15 may be formed in a screw hole shape. Then, they may be fitted to each other.

Furthermore, in the third modification, as in the case of the further modification of the second modification, the surface of the support column 15 may not be coated with a metal oxide film or a non-metal film, and the metal base material thereof may be exposed on the surface. By forming the support pin 16 in contact with the wafer 200 with a non-metal material or a metal oxide as in the present embodiments, it is possible to suppress metal contamination of the wafer 200 or the like caused by the metal that constitutes the support column 15. By not performing the coating process to the surface of the support column 15 as described above, the boat 217 can be manufactured more easily than when the coating process is performed.

Fourth Modification

Figure 10:
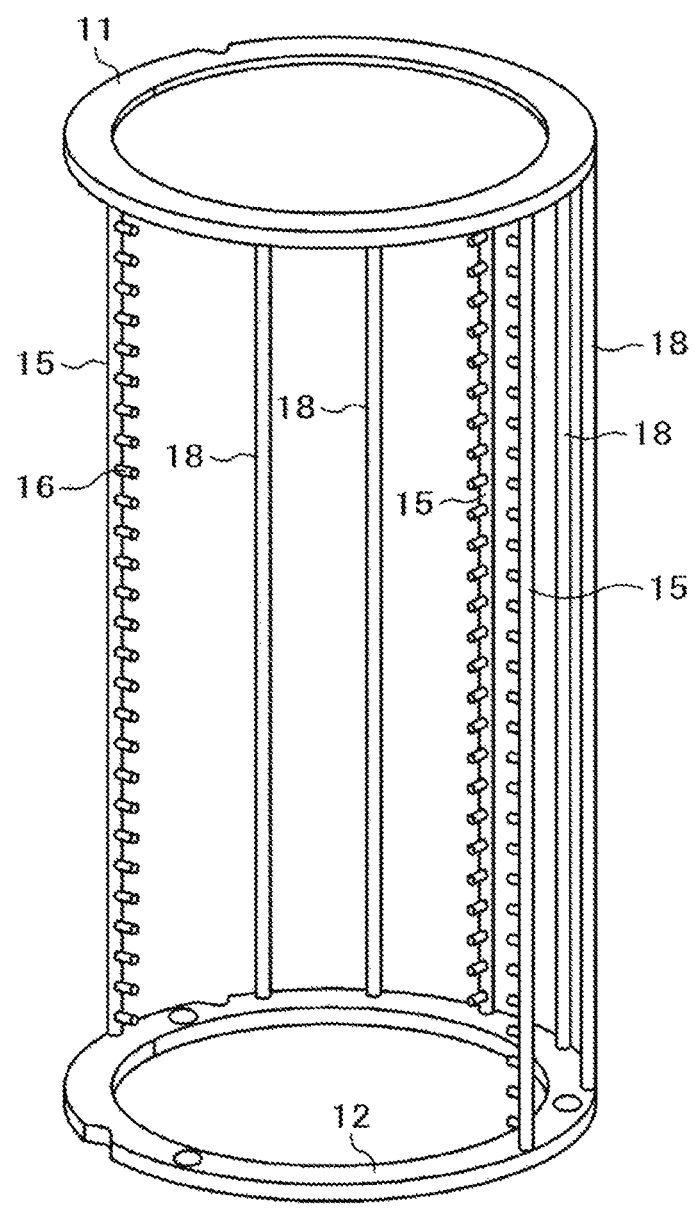
FIG. 10 is a perspective view of a boat according to a fourth modification.

As shown in FIG. 10, the boat 217 according to a fourth modification of the present embodiments includes support columns 15 installed at the outer peripheries of the top plate 11 and the bottom plate 12 and configured to hold the wafers 200, and auxiliary support columns 18 installed at the outer peripheries of the top plate 11 and the bottom plate 12 and having a smaller diameter than the support columns 15. Similarly to the embodiments, the second modification or the third modification, support pins 16 as supports (mounting stages) that support (mount) the wafers 200 are installed on the support columns 15.

Figure 11:
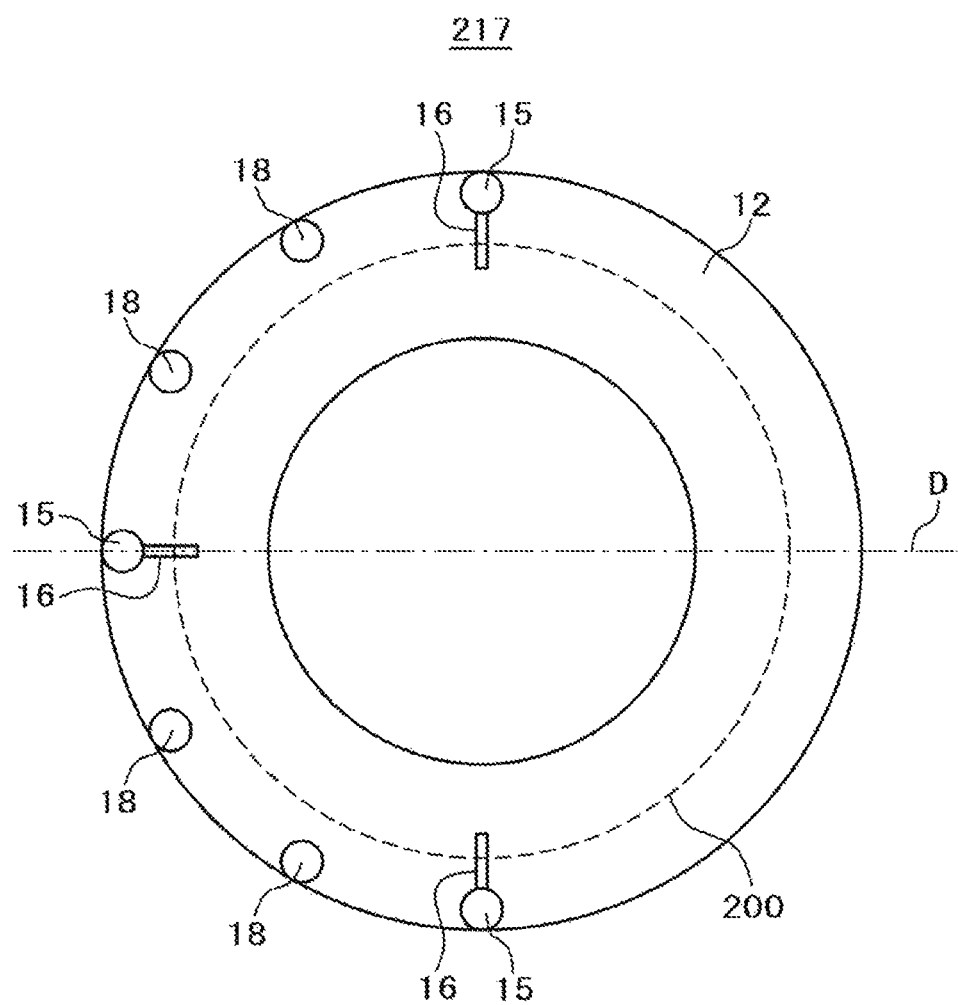
FIG. 11 is a horizontal sectional view of the boat shown in FIG. 10.

Furthermore, as shown in FIG. 11, the auxiliary support columns 18 are installed at positions where the auxiliary support columns 18 evenly divide the space between the support columns 15. Specifically, the boat 217 is configured such that the spaces between the support columns 15 and the auxiliary support columns 18, or the spaces between the auxiliary support columns 18 are equidistant in the circumferential direction. Furthermore, as shown in FIG. 11, the boat 217 includes a plurality of support columns 15. The support column 15 serving as a reference is installed in the direction in which the wafer 200 is supported. The support column 15 serving as a reference is located on a reference line D of a dashed-dotted line. The support columns 15 and the auxiliary support columns 18 are installed at positions symmetrical with respect to the reference line D.

Furthermore, the diameter of the auxiliary support columns 18 is smaller than the diameter of the support columns 15. The auxiliary support columns 18 are not provided with support pins 16. This is because the auxiliary support columns 18 are auxiliary ones. The number of the auxiliary support columns 18 does not have to be four. In the present embodiments, the three support columns 15 and the four auxiliary support columns 18 are evenly provided in the circumferential direction of the wafer 200 between the support columns 15 and the auxiliary support columns 18 or between the auxiliary support columns 18. However, the present disclosure is not limited to this form.

The support columns 15 of the boat 217 of this modification are configured to be thinner than the support columns 15 of the boat 217 of the above-described embodiments, and the four auxiliary support columns 18 are attached for securing strength. For example, the diameter φ of the support columns 15 of the boat 217 of the embodiments shown in FIG. 5 is 8 mm, the diameter φ of the support columns 15 of the boat 217 of this modification shown in FIG. 11 is φ 5 mm, and the diameter φ of the auxiliary support columns 18 is φ 4 mm.

Next, the configuration of the controller 121, which is a control part (control means) that controls the operation of the substrate processing apparatus 10 described above, will be described with reference to FIG. 12.

Figure 12:
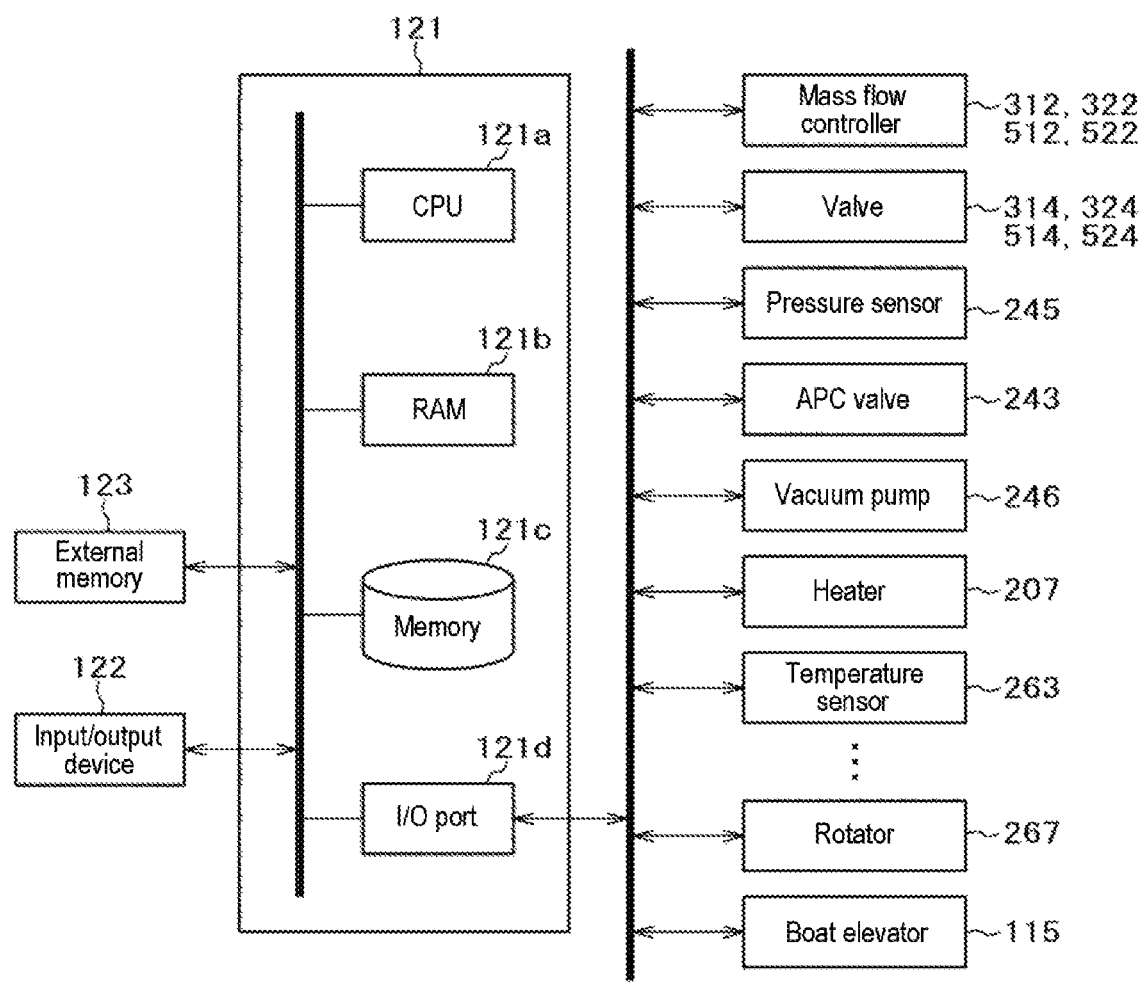
FIG. 12 is a schematic configuration diagram of a controller of the substrate processing apparatus shown in FIG. 1, and is a schematic block diagram showing a control system of the controller.

As shown in FIG. 12, the controller 121, which is a control part (control means), is configured as a computer including a CPU (Central Processing Unit) 121a, a RAM (Random Access Memory) 121b, a memory 121c, and an I/O port 121d. The RAM 121b, the memory 121c, and the I/O port 121d are configured to be able to exchange data with the CPU 121a via an internal bus. An input/output device 122 configured as a touch panel or the like is connected to the controller 121.

The memory 121c is formed of, for example, a flash memory, a HDD (Hard Disk Drive), a SSD (Solid State Drive), or the like. In the memory 121c, a control program for controlling the operation of the substrate processing apparatus, a process recipe in which the procedure and conditions of a method of manufacturing a semiconductor device described later, and the like are stored in a readable manner. The process recipe is a combination capable of causing the controller 121 to execute each step (each step, each procedure, or each process) in a method of manufacturing a semiconductor device described later and obtaining a predetermined result. The process recipe functions as a program. Hereinafter, the process recipe, the control program, and the like are collectively and simply referred to as a program. When the term program is used in the present disclosure, it may include the process recipe, the control program, or a combination of the process recipe and the control program. The RAM 121b is configured as a memory area (work area) in which programs and data read by the CPU 121a are temporarily stored.

The I/O port 121d is connected to the MFCs 312, 322, 332, 342, 352, 512 and 522, the valves 314, 324, 334, 344, 354, 514 and 524, the pressure sensor 245, the APC valve 243, the vacuum pump 246, the heater 207, the temperature sensor 263, the rotator 267, the boat elevator 115, and the like.

The CPU 121a is configured to read the control program from the memory 121c and execute the control program, and is configured to read the process recipe and the like from the memory 121c in response to an input of an operation command from the input/output device 122. The CPU 121a is configured to, according to the contents of the read process recipe, control the flow rate adjustment operation of various gases by the MFCs 312, 322, 332, 342, 352, 512 and 522, the opening/closing operation of the valves 314, 324, 334, 344, 354, 514 and 524, the opening/closing operation of the APC valve 243, the pressure-regulating operation by the APC valve 243 based on the pressure sensor 245, the temperature-adjusting operation of the heater 207 based on the temperature sensor 263, the start and stop of the vacuum pump 246, the rotation and rotation speed adjusting operation of the boat 217 by the rotator 267, the raising/lowering operation of the boat 217 by the boat elevator 115, the accommodation operation of the wafers 200 in the boat 217, and the like.

The controller 121 may be configured by installing, in the computer, the above-described program stored in an external memory 123 (e.g., a magnetic tape, a magnetic disk such as a flexible disk, a hard disk, or the like, an optical disk such as a CD, a DVD, or the like, a magneto-optical disk such as a MO or the like, and a semiconductor memory such as a USB memory, a memory card or the like). The memory 121c and the external memory 123 are configured as a computer-readable recording medium. Hereinafter, the memory 121c and the external memory 123 are also collectively and simply referred to as a recording medium. As used herein, the term "recording medium" may include the memory 121c, the external memory 123, or both them. The provision of the program to the computer may be performed by using a communication means such as the Internet or a dedicated line without using the external memory 123.

(2) Substrate Processing Process (Process of Manufacturing Semiconductor Device)

As one of processes of manufacturing a semiconductor device, an example of forming a film on a wafer 200 will be described with reference to FIG. 13. In the following description, the operations of the respective parts constituting the substrate processing apparatus 10 are controlled by the controller 121.

In the first example described below, an AlO film as a metal oxide film is formed on the wafer 200 by performing, a predetermined number of times, a step of supplying a TMA gas as a precursor gas into the process chamber 201 from the plurality of gas supply holes 410a of the nozzle 410 while heating the process chamber 201 that accommodates the wafers 200 as substrates in a stacked state to a predetermined temperature, and a step of supplying an O3 gas as a reaction gas from the plurality of gas supply holes 420a of the nozzle 420.

When the term "wafer" is used herein, it may refer to "a wafer itself" or "a laminated body of a wafer and a predetermined layer or film formed on the surface of the wafer." When the phrase "a surface of a wafer" is used herein, it may refer to "a surface of a wafer itself" or "a surface of a predetermined layer or the like formed on a wafer." When the expression "a predetermined layer is formed on a wafer" is used herein, it may mean that "a predetermined layer is directly formed on a surface of a wafer itself" or that "a predetermined layer is formed on a layer or the like formed on a wafer." When the term "substrate" is used herein, it may be synonymous with the term "wafer."

The substrate-processing process including a film-forming step S300 will be described below with reference to FIGS. 1 and 13.

Substrate-Loading Step S301

When a plurality of wafers 200 is charged onto the support pins 16 of the boat 217 (wafer charging), as shown in FIG. 1, the boat 217 that accommodates the plurality of wafers 200 is raised by the boat elevator 115 and loaded into the process chamber 201 (boat loading). In this state, the seal cap 219 seals the lower end of the manifold 209 via the O-ring 220b.

Atmosphere-Adjusting Step S302

Subsequently, the inside of the process chamber 201, i.e., the space in which the wafers 200 exist, is evacuated by the vacuum pump 246 so as to have a desired pressure (vacuum degree).

At this time, the pressure inside the process chamber 201 is measured by the pressure sensor 245, and the APC valve 243 is feedback-controlled based on the measured pressure information (pressure regulation). The vacuum pump 246 is kept constantly operated at least until the process to the wafers 200 is completed. Furthermore, the heater 207 heats the inside of the process chamber 201 to a desired temperature. At this time, the amount of supplying electric power to the heater 207 is feedback-controlled based on the temperature information detected by the temperature sensor 263 so that the inside of the process chamber 201 has a desired temperature distribution (temperature adjustment). The heating of the inside of the process chamber 201 by the heater 207 is continuously performed at least until the process to the wafers 200 is completed. In the case of rotating the boat 217, the rotator 267 starts rotating the boat 217 and the wafers 200. The rotation of the boat 217 and the wafers 200 by the rotator 267 is continuously performed at least until the process to the wafers 200 is completed. Furthermore, the supply of a $N_2$ gas as an inert gas from the gas supply pipe 350 to below the heat-insulating portion 218 may be started. Specifically, the valve 354 is opened, and the flow rate of the $N_2$ gas is adjusted to a flow rate in a range of 0.1 to 2 slm by the MFC 352. The flow rate of the MFC 352 is preferably 0.3 slm to 0.5 slm.

[Film-Forming Step S300]

Subsequently, a first step (precursor gas supply step), a purging step (residual gas removal step), a second step (reaction gas supply step), and a purging step (residual gas removal step) are performed a predetermined number of times N (N≥1) to form an AlO film.

First Step S303 (First Gas Supply)

The valve 314 is opened, and a TMA gas, which is a first gas (precursor gas), is allowed to flow through the gas supply pipe 310. The flow rate of the TMA gas is adjusted by the MFC 312. The TMA gas is supplied into the process chamber 201 from the gas supply holes 410a of the nozzle 410, and is exhausted from the exhaust pipe 231. At this time, the TMA gas is supplied to the wafers 200. At the same time, the valve 514 may be opened, and an inert gas such as a $N_2$ gas or the like may be allowed to flow through the gas supply pipe 510. The flow rate of the $N_2$ gas flowing through the gas supply pipe 510 is adjusted by the MFC 512. The $N_2$ gas is supplied into the process chamber 201 together with the TMA gas, and is exhausted from the exhaust pipe 231. The $N_2$ gas is supplied into the process chamber 201 via the gas supply pipe 320 and the nozzle 420, and is exhausted from the exhaust pipe 231.

At this time, the APC valve 243 is adjusted so that the pressure in the process chamber 201 is set to a pressure falling within a range of, for example, 1 to 1000 Pa, preferably 1 to 100 Pa, and more preferably 10 to 50 Pa. By setting the pressure in the process chamber 201 to 1000 Pa or smaller, it is possible to suitably perform the residual gas removal described later and to prevent the TMA gas from being self-decomposed in the nozzle 410 and deposited on the inner wall of the nozzle 410. By setting the pressure in the process chamber 201 to 1 Pa or higher, it is possible to increase the reaction rate of the TMA gas on the surfaces of the wafers 200 and to obtain a practical deposition rate. In the present disclosure, when the range of numerical values is described as 1 to 1000 Pa, it may refer to 1 Pa or larger and 1000 Pa or smaller. That is, 1 Pa and 1000 Pa are included in the range of numerical values. The same applies to numerical values described in the present disclosure, such as a pressure, a flow rate, a time, a temperature, and the like.

The supply flow rate of the TMA gas controlled by the MFC 312 is set to a flow rate falling within a range of, for example, 10 to 2000 sccm, preferably 50 to 1000 sccm, and more preferably 100 to 500 sccm. By setting the flow rate to 2000 sccm or smaller, it is possible to suitably perform the residual gas removal described later and to prevent the TMA gas from being self-decomposed in the nozzle 410 and deposited on the inner wall of the nozzle 410. By setting the flow rate to 10 sccm or larger, it is possible to increase the reaction of the TMA gas on the surfaces of the wafers 200 and to obtain a practical deposition rate.

The supply flow rate of the $N_2$ gas controlled by the MFC 512 is set to a flow rate falling within a range of, for example, 1 to 30 slm, preferably 1 to 20 slm, and more preferably 1 to 10 slm.

The time for supplying the TMA gas to the wafers 200 is set to fall within a range of, for example, 1 to 60 seconds, preferably 1 to 20 seconds, and more preferably 2 to 15 seconds.

The heater 207 heats the wafer 200 so that the temperature of the wafers 200 is to fall within a range of, for example, room temperature to 400 degrees C., preferably 90 to 400 degrees C., and more preferably 150 to 400 degrees C. The temperature is set to 400 degrees C. or lower. The lower limit of the temperature may be changed depending on the characteristics of the oxidant used as the reaction gas. By setting the upper limit of the temperature to 400 degrees C., when a substrate-processing process is performed by using the boat 217 disclosed in the above-described embodiments or its modifications, it is possible to more reliably prevent the generation of metal contamination to the wafers 200.

By supplying the TMA gas into the process chamber 201 under the above-mentioned conditions, an Al-containing layer is formed on the outermost surface of the wafer 200. The Al-containing layer may contain C and H in addition to an Al layer. The Al-containing layer is formed by causing TMA to be physically adsorbed on the outermost surface of the wafer 200, causing a substance obtained by partially decomposing TMA to be chemically adsorbed on the outermost surface of the wafer 200, or thermally decomposing TMA so that Al is deposited. That is, the Al-containing layer may be an adsorption layer (physical adsorption layer or chemical adsorption layer) of TMA or a substance obtained by partially decomposing TMA, or may be an Al deposition layer (Al layer).

Purging Step S304 (Residual Gas Removal Step)

After the Al-containing layer is formed, the valve 314 is closed and the supply of the TMA gas is stopped. At this time, while keeping the APC valve 243 opened, the inside of the process chamber 201 is evacuated by the vacuum pump 246 to remove the unreacted TMA gas or the TMA gas contributed to the formation of the Al-containing layer, which remains in the process chamber 201, from the process chamber 201. The valves 514 and 524 are kept opened to maintain the supply of the $N_2$ gas into the process chamber 201. The $N_2$ gas acts as a purge gas and can enhance the effect of removing the unreacted TMA gas or the TMA gas contributed to the formation of the Al-containing layer, which remains in the process chamber 201, from the process chamber 201.

Next, the second step (reaction gas supply step) is performed.

Second Step S305 (Reaction Gas Supply Step)

After removing the residual gas in the process chamber 201, the valve 324 is opened, and an $O_3$ gas as a reaction gas is allowed to flow through the gas supply pipe 320. The flow rate of the $O_3$ gas is adjusted by the MFC 322. The $O_3$ gas is supplied to the wafers 200 in the process chamber 201 from the gas supply holes 420a of the nozzle 420, and is exhausted from the exhaust pipe 231. That is, the wafers 200 are exposed to the $O_3$ gas. At this time, the valve 524 may be opened, and the $N_2$ gas may be allowed to flow into the gas supply pipe 520. The flow rate of the $N_2$ gas is adjusted by the MFC 522. The $N_2$ gas is supplied into the process chamber 201 together with the $O_3$ gas, and is exhausted from the exhaust pipe 231. The $N_2$ gas is supplied into the process chamber 201 via the gas supply pipe 510 and the nozzle 410, and is exhausted from the exhaust pipe 231. When the flash tank 321 is installed at the gas supply pipe 320 on the upstream side of the valve 324, the $O_3$ gas stored in the flash tank 321 is supplied into the process chamber 201 as the valve 324 is opened.

The $O_3$ gas reacts with at least a part of the Al-containing layer formed on the wafer 200 in the first step S303. The Al-containing layer is oxidized to form an aluminum oxide layer (AlO layer) containing Al and O as a metal oxide layer. That is, the Al-containing layer is modified into the AlO layer.

Purging Step S306 (Residual Gas Removal Step)

After the AlO layer is formed, the valve 324 is closed and the supply of the $O_3$ gas is stopped. Then, by the same processing procedure as that of the residual gas removal step performed after the precursor gas supply step, the unreacted $O_3$ gas, the $O_3$ gas contributed to the formation of the AlO layer and the reaction byproducts, which remain in the process chamber 201, are removed from the process chamber 201.

Performing a Predetermined Number of Times

An AlO film is formed on the wafer 200 by executing a cycle that sequentially performs the first step S303, the purging step S304, the second step S305, and the purging step S306, a predetermined number of times N. The number of execution times of the cycle is appropriately selected according to the film thickness required in a finally formed AlO film. In the determination step S307, it is determined whether or not the cycle has been executed the predetermined number of times. If the cycle has been executed the predetermined number of times, the determination is made to be Yes (Y) and the film-forming step S300 is ended. If the cycle is not executed the predetermined number of times, the determination is made to be No (N) and the film-forming step S300 is repeated. This cycle is preferably repeated a plurality of times. The thickness (film thickness) of the AlO film is set to, for example, 10 to 150 nm, preferably 40 to 100 nm, and more preferably 60 to 80 nm. By setting the film thickness to 150 nm or smaller, it is possible to reduce the surface roughness. By setting the film thickness to 10 nm or larger, it is possible to suppress generation of film peeling due to the stress difference between the AlO film and the underlying film.

Atmosphere-Adjusting Step S308
(After-Purging/Atmospheric Pressure Restoration)

When the film-forming step S300 is completed, the valves 514 and 524 are opened, and the $N_2$ gas is supplied into the process chamber 201 from each of the gas supply pipes 310 and 320 and exhausted from the exhaust pipe 231. The $N_2$ gas acts as a purge gas, and the gas and byproducts remaining in the process chamber 201 are removed from the inside of the process chamber 201 (after-purging). Thereafter, the atmosphere in the process chamber 201 is replaced by the $N_2$ gas ($N_2$ gas replacement), and the pressure in the process chamber 201 is returned to the atmospheric pressure (atmospheric pressure restoration).

Substrate-Unloading Step S309 (Boat Unloading/Wafer Discharging)

Thereafter, the seal cap 219 is lowered by the boat elevator 115 to open the lower end of the manifold 209. The processed wafers 200 are unloaded from the lower end of the manifold 209 to the outside of the outer tube 203 while being supported on the boat 217 (boat unloading). The processed wafers 200 unloaded to the outside of the outer tube 203 are taken out from the boat 217 (wafer discharging).

By performing such a substrate-processing process, a desired film is deposited on the wafer 200. That is, it is possible to improve the processing uniformity of each of the wafers 200 supported by the boat 217 and the in-plane processing uniformity of the wafers 200.

In the second example of the present embodiments, a zirconium oxide film (ZrO film) containing Zr and O is formed on the wafer 200 by performing, a predetermined number of times N' (N'≥1 time), a step of supplying a TEMAZ gas as a precursor gas from the gas supply holes 410a of the nozzle 410 into the process chamber 201 while heating the process chamber 201 accommodating a plurality of wafers 200 as substrates in a stacked state to a predetermined temperature, and a step of supplying a reaction gas from the gas supply holes 420a of the nozzle 420.

Substrate-Loading Step S301

The substrate-loading step S301 of the second example is the same as that of the first example.

Atmosphere-Adjusting Step S302

The atmosphere-adjusting step S302 of the second example is the same as that of the first example.
[Film-Forming Step S300]

A step of forming a ZrO film, which is a high-dielectric-constant oxide film, on the wafer 200 as a metal oxide film is executed.

First Step S303 (First Gas Supply Step)

The valve 314 is opened, and a TEMAZ gas, which is a precursor gas as a processing gas, is allowed to flow through the gas supply pipe 310. The flow rate of the TEMAZ gas is adjusted by the MFC 312. The TEMAZ gas is supplied into the process chamber 201 from the gas supply holes 410a of the nozzle 410 and is exhausted from the exhaust pipe 231. At this time, the TEMAZ gas is supplied to the wafers 200. At the same time, the valve 514 is opened and a $N_2$ gas is allowed to flow through the gas supply pipe 510. The flow rate of the $N_2$ gas flowing through the gas supply pipe 510 is adjusted by the MFC 512. The $N_2$ gas is supplied into the process chamber 201 from the gas supply holes 410a of the nozzle 410 together with the TEMAZ gas and is exhausted from the exhaust pipe 231.

In order to prevent the TEMAZ gas from entering the nozzle 420, the valve 524 is opened and the $N_2$ gas is allowed to flow through the gas supply pipe 520. The $N_2$ gas is supplied into the process chamber 201 via the gas supply pipe 320 and the nozzle 420, and is exhausted from the exhaust pipe 231.

At this time, the APC valve 243 is appropriately adjusted so that the pressure in the process chamber 201 is set to a pressure falling within a range of, for example, 20 to 500 Pa. The supply flow rate of the TEMAZ gas controlled by the MFC 312 is set to a flow rate falling within a range of, for example, 0.1 to 5.0 g/min. The time for exposing the wafers 200 to TEMAZ, i.e., the gas supply time (irradiation time) is set to a time falling within a range of, for example, 10 to 300 seconds. At this time, the temperature of the heater 207 is set to such a temperature that the temperature of the wafers 200 falls within a range of, for example, 150 to 400 degrees C. By supplying the TEMAZ gas, a Zr-containing layer is formed on the wafer 200. In the Zr-containing layer, a small amount of organic substances (carbon (C), hydrogen (H), nitrogen (N), etc.) derived from the TEMAZ gas remains as residual elements.

Purging Step S304 (Residual Gas Removal Step)

After supplying the TEMAZ gas for a predetermined time, the valve 314 is closed and the supply of the TEMAZ gas is stopped. At this time, while keeping the APC valve 243 of the exhaust pipe 231 opened, the inside of the process chamber 201 is evacuated by the vacuum pump 246, whereby the unreacted TEMAZ gas or the TEMAZ gas contributed to the reaction, which remains in the process chamber 201, is removed from the process chamber 201. At this time, the valve 524 is kept opened to maintain the supply of the $N_2$ gas into the process chamber 201. The $N_2$ gas acts as a purge gas.

Second Step S305 (Reaction Gas Supply Step)

After removing the gas remaining in the process chamber 201, the valve 324 is opened, and an $O_3$ gas, which is an oxygen-containing gas, is allowed to flow through the gas supply pipe 320. The flow rate of the $O_3$ gas is adjusted by the MFC 322. The $O_3$ gas is supplied into the process chamber 201 through the gas supply holes 420a of the nozzle 420 and is exhausted from the exhaust pipe 231. At this time, the $O_3$ gas is supplied to the wafers 200. At the same time, the valve 524 is opened, and an inert gas such as a $N_2$ gas or the like is allowed to flow through the gas supply pipe 520. The flow rate of the $N_2$ gas flowing through the gas supply pipe 520 is adjusted by the MFC 522. The $N_2$ gas is supplied into the process chamber 201 together with the $O_3$ gas and is exhausted from the exhaust pipe 231.

When supplying the $O_3$ gas, the APC valve 243 is properly adjusted so that the pressure in the process chamber 201 is set to, for example, 110 Pa. The total supply flow rate of the $O_3$ gas supplied from the nozzle 420 controlled by the MFC 322 is set to, for example, 70 slm. The flow rate of the $O_3$ gas controlled by the MFC 322 and the APC valve 243 is set to a flow rate falling within a range of, for example, 7.0 m/s to 8.5 m/s. The partial pressure of the $O_3$ gas is set to a pressure of, for example, 9.0 Pa (about 8.0% of the pressure in the process chamber 201) to 12.0 Pa (about 11.0% of the pressure in the process chamber 201), and more preferably 11.0 Pa (10.0% of the pressure in the process chamber 201). The concentration of the $O_3$ gas supplied into the process chamber 201 is set to 250 g/Nm$^3$. The time for exposing the wafers 200 to the $O_3$ gas, i.e., the gas supply time (irradiation time) is set to a time falling within a range of, for example, 30 to 120 seconds. The temperature of the heater 207 at this time is the same as that in step S101. By the supply of the $O_3$ gas, the Zr-containing layer formed on the wafer 200 is oxidized to form a ZrO layer. At this time, a small amount of organic substances (carbon (C), hydrogen (H), nitrogen (N), etc.) derived from the TEMAZ gas remains in the ZrO layer.

In the present embodiments, the $O_3$ gas is supplied by using one nozzle 420, but the number of nozzles is not limited thereto. The $O_3$ gas may be supplied by, for example, three nozzles.

Purging Step S306 (Residual Gas Removal Step)

After the ZrO layer is formed, the valve 324 is closed and the supply of the $O_3$ gas is stopped. Then, by the same processing procedure as that of the residual gas removal step performed before the $O_3$ gas supply step, the unreacted $O_3$ gas or the $O_3$ gas contributed to the formation of the ZrO layer, which remains in the process chamber 201, is removed from the process chamber 201.

[Performing a Predetermined Number of Times]

By executing a cycle that sequentially performs the first step S303, the purging step S304, the second step S305, and the purging step S306, one or more times (predetermined number N'), a ZrO film having a predetermined thickness is formed on the wafer 200. The above cycle is preferably repeated multiple times. When the ZrO film is formed in this manner, the TEMAZ gas and the $O_3$ gas are alternately (time-divisionally) supplied to the wafer 200 so as not to be mixed with each other.

Atmosphere-Adjusting Step S308
(After-Purging/Atmospheric Pressure Restoration)

The atmosphere-adjusting step S308 of the second example is the same as that of the first example.

Substrate-Unloading Step S309 (Boat Unloading/Wafer Discharging)

The substrate-unloading step S309 of the second example is the same as that of the first example.

Although various typical embodiments of the present disclosure have been described above, the present disclosure is not limited to those embodiments. The above-described embodiments may be used in appropriate combinations. Moreover, the present disclosure is not limited thereto.

For example, in the above-described embodiments, there has been described the example in which the reaction container (process container) is composed of the outer tube 203 and the inner tube 204. However, the reaction container may be composed of the outer tube 203.

Furthermore, in the first example of the above-described embodiments, there has been described the example in which the TMA gas is used as the Al-containing gas. However, the present disclosure is not limited thereto. For example, aluminum chloride ($AlCl_3$) or the like may be used. Although there has been described the example in which the $O_3$ gas is used as the O-containing gas, the present disclosure is not limited thereto. For example, oxygen ($O_2$), water ($H_2O$), hydrogen peroxide ($H_2O_2$), or a combination of $O_2$ plasma and hydrogen ($H_2$) plasma may also be used. Although there has been described the example in which the $N_2$ gas is used as the inert gas, the present disclosure is not limited thereto. For example, a rare gas such as an Ar gas, a He gas, a Ne gas, or a Xe gas may be used.

Furthermore, although there has been described the example in which the Al-containing gas is used as the first gas, the present disclosure is not limited thereto. The following gases may be used. For example, the first gas may be a gas containing a silicon (Si) element, a gas containing a titanium (Ti) element, a gas containing a tantalum (Ta) element, a gas containing a zirconium (Zr) element, a gas containing a hafnium (Hf) element, a gas containing a tungsten (W) element, a gas containing a niobium (Nb) element, a gas containing a molybdenum (Mo) element, a gas containing an yttrium (Y) element, a gas containing a lanthanum (La) element, a gas containing a strontium (Sr) element, and the like. In addition, a gas containing a plurality of elements described in the present disclosure may be used. Moreover, a plurality of gases containing any of the elements described in the present disclosure may be used.

Furthermore, although there has been described the example in which the oxygen-containing gas is used as the second gas, the present disclosure is not limited thereto. The following gases may be used. For example, the second gas may be a gas containing a nitrogen (N) element, a gas containing a hydrogen (H) element, a gas containing a carbon (C) element, a gas containing a boron (B) element, a gas containing a phosphorus (P) element, and the like. In addition, a gas containing a plurality of elements described in the present disclosure may be used. Moreover, a plurality of gases containing any of the elements described in the present disclosure may be used.

In the above description, there has been described the example in which the first gas and the second gas are supplied sequentially. However, the substrate processing apparatus 10 of the present disclosure may be configured to have a timing at which the first gas and the second gas are supplied in parallel. In the process of supplying the first gas and the second gas in parallel, it is possible to significantly increase the film-forming rate. This makes it possible to shorten the time required for the film-forming step S300 and to improve the manufacturing throughput of the substrate processing apparatus 10.

Furthermore, in the above description, there has been described the example in which the AlO film is formed on the substrate. However, the present disclosure is not limited thereto. Other types of films may also be formed. By appropriately combining the above-described gases, it may be possible to form a nitride film, a carbonitride film, an oxide film, an oxycarbide film, an oxynitride film, an oxycarbonitride film, a boronitride film, a borocarbonitride film, a film composed of a metal element, or the like, which contains, for example, at least one selected from the group of titanium (Ti), zirconium (Zr), hafnium (Hf), tantalum (Ta), niobium (Nb), molybdenum (Mo), tungsten (W), yttrium (Y), lanthanum (La), strontium (Sr), and silicon (Si).

Furthermore, in the above description, there has been described the process of depositing the film on the substrate. However, the present disclosure is not limited thereto and may also be applied to other processes. For example, the wafer 200 may be processed by supplying the second gas (reaction gas) to the wafer 200. By supplying the second gas to the wafer 200, the surface of the wafer 200 can be subjected to a process such as oxidation or the like. In this case, it is possible to suppress deterioration (oxidation) of the members arranged in a low temperature region.

Furthermore, in the second example of the above-described embodiments, TEMAZ is exemplified as the organic precursor. However, the present disclosure is not limited thereto. Other precursors may be used. For example, an organic Hf precursor such as tetrakisethylmethylaminohafnium ($Hf[N(CH_3)CH_2CH_3]_4$, abbreviation: TEMAH) or the like, an organic Al precursor such as trimethylaluminum (($CH_3)_3Al$, abbreviation: TMA) or the like, an organic Si precursor such as trisdimethylaminosilane ($SiH(N(CH_3)_2)_3$, abbreviation: TDMAS) or the like, an organic Ti precursor such as tetrakisdimethylaminotitanium ($Ti[N(CH_3)_2]_4$, abbreviation: TDMAT) or the like, and an organic Ta precursor such as pentakisdimethylaminotantalum ($Ta(N(CH_3)_2)_5$, abbreviation: PDMAT) or the like may also be used.

Furthermore, in the second example of the above-described embodiments, there has been described the example in which the $O_3$ gas is used in the film-forming step. However, the present disclosure is not limited thereto. Other precursors may also be used as long as they are oxygen-containing gases. For example, $O_2$, $O_2$ plasma, $H_2O$, $H_2O_2$, $N_2O$, and the like may also be used.

Furthermore, the above-described embodiments and modifications may be appropriately combined and used. The processing procedures and the processing conditions at this time may be the same as the processing procedures and the processing conditions of the above-described embodiments and modifications.

Furthermore, although the vertical substrate processing apparatus that processes a plurality of substrates at a time has been described above, the technique of the present disclosure may also be applied to a single-wafer processing apparatus that processes one substrate at a time.

Furthermore, in the above description, there has been described the example in which the film-forming process as one of processes of manufacturing a semiconductor device is performed as the substrate-processing process executed in the substrate processing apparatus 10. However, the present disclosure is not limited thereto. Other substrate-processing processes may also be executed. In addition to the process of manufacturing the semiconductor device, a substrate-processing process performed in one of processes of manufacturing a display device, one of processes of manufacturing a ceramic substrate, or the like may be executed.

According to the present disclosure in some embodiments, it is possible to improve the uniformity of the thickness of a film formed on a substrate and to suppress metal contamination of the substrate and the film formed on the substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus, comprising:
a substrate support including:
a plurality of support columns made of metal; and
a plurality of supports installed at the plurality of support columns and configured to support a plurality of substrates in multiple stages;
a process chamber configured to accommodate the plurality of substrates supported by the substrate support; and
a heater configured to heat the plurality of substrates accommodated in the process chamber,
wherein each of the plurality of supports comprises a plurality of support pins inserted into holes as recesses in the plurality of support columns and are fixed at predetermined intervals, wherein a diameter of the plurality of support columns is between 5 mm to 10 mm, and
wherein each of the plurality of support pins includes:
a metal portion made of metal that is directly connected to one of the plurality of support columns; and
a contact portion that has a semicircular columnar shape or a flat plate shape, is configured to make contact with one of the plurality of substrates, and is composed of a film of a non-metal material that covers the metal portion, wherein the non-metal material is at least one material selected from the group of silicon, silicon oxide, silicon nitride, and silicon carbide.

2. The substrate processing apparatus of claim 1, wherein the plurality of support columns is covered with at least one coating selected from the group of a film of a metal oxide and a film of a non-metal material.

3. The substrate processing apparatus of claim 1, wherein the plurality of support columns includes at least a portion that is not covered with a film of a metal oxide or a film of a non-metal material and exposes its surface made of the metal.

4. The substrate processing apparatus of claim 2, wherein the metal oxide is at least one selected from the group of chromium oxide and aluminum oxide.

5. A substrate support configured to support a plurality of substrates to be accommodated in a process chamber, comprising:
a plurality of support columns made of metal; and
a plurality of supports installed at the plurality of support columns and configured to support the plurality of substrates in multiple stages,
wherein each of the plurality of supports comprises a plurality of support pins inserted into holes as recesses in the plurality of support columns and are fixed at predetermined intervals, wherein a diameter of the plurality of support columns is between 5 mm to 10 mm, and
wherein each of the plurality of support pins includes:
a metal portion made of metal directly connected to one of the plurality of support columns; and
a contact portion that has a semicircular columnar shape or a flat plate shape, is configured to make contact with one of the plurality of substrates, and is composed of a film of a non-metal material that covers the metal portion, wherein the non-metal material is at least one material selected from the group of silicon, silicon oxide, silicon nitride, and silicon carbide.

6. The substrate processing apparatus of claim 1, wherein a pitch between the predetermined intervals is 8 mm.

7. The substrate support of claim 5, wherein a pitch between the predetermined intervals is 8 mm.

* * * * *